(12) United States Patent
Ohyanagi et al.

(10) Patent No.: US 6,657,257 B2
(45) Date of Patent: Dec. 2, 2003

(54) INSULATED GATE FIELD EFFECT TRANSISTOR AND SEMICONDUCTOR INTEGRATED CIRCUIT

(75) Inventors: Takasumi Ohyanagi, Hamura (JP); Atsuo Watanabe, Hitachiohta (JP)

(73) Assignee: Hitachi, Ltd., Tokyo (JP)

(*) Notice: Subject to any disclaimer, the term of this patent is extended or adjusted under 35 U.S.C. 154(b) by 0 days.

(21) Appl. No.: 09/829,582

(22) Filed: Apr. 9, 2001

(65) Prior Publication Data

US 2001/0038125 A1 Nov. 8, 2001

(30) Foreign Application Priority Data

Apr. 26, 2000 (JP) .......................... 2000-131509

(51) Int. Cl.[7] .............................................. H01L 27/01
(52) U.S. Cl. ........................ 257/347; 257/343; 257/347; 257/348; 257/350; 257/351; 257/354; 257/368; 257/369; 257/492; 438/149; 438/479; 438/517
(58) Field of Search ................................. 257/347, 348, 257/350, 351, 354, 368, 369, 343, 492; 438/149, 479, 517

(56) References Cited

U.S. PATENT DOCUMENTS

| | | | | |
|---|---|---|---|---|
| 5,283,454 A | * | 2/1994 | Cambou | 257/328 |
| 5,430,316 A | * | 7/1995 | Contiero et al. | 257/335 |
| 5,485,027 A | * | 1/1996 | Williams et al. | 257/343 |
| 5,599,722 A | * | 2/1997 | Sugisaka et al. | 437/21 |
| 5,859,457 A | * | 1/1999 | Thiel et al. | 257/335 |
| 5,932,897 A | * | 8/1999 | Kawaguchi et al. | 257/141 |
| 6,150,697 A | * | 11/2000 | Teshigahara et al. | 257/347 |
| 6,310,378 B1 | * | 10/2001 | Letavic et al. | 257/347 |

* cited by examiner

Primary Examiner—Jerome Jackson
Assistant Examiner—Edgardo Ortiz
(74) Attorney, Agent, or Firm—Hogan & Hartson, LLP

(57) ABSTRACT

According to the present invention, there is provided an N-type insulated gate field effect transistor using an SOI substrate of which Si layer as a device formation area is N-type. The SOI substrate provided as the device formation area has the N-type semiconductor region, which has an impurity concentration higher than the impurity concentration of the device formation area, formed so that the N-type semiconductor region is contacted to a part of a gate insulating film and a field silicon oxide film formed between a source electrode and a drain electrode, and extends to be contacted to the N-type semiconductor diffusion layer contacted to the drain electrode. According to the above arrangement, the on-state breakdown can be remarkably improved.

25 Claims, 24 Drawing Sheets

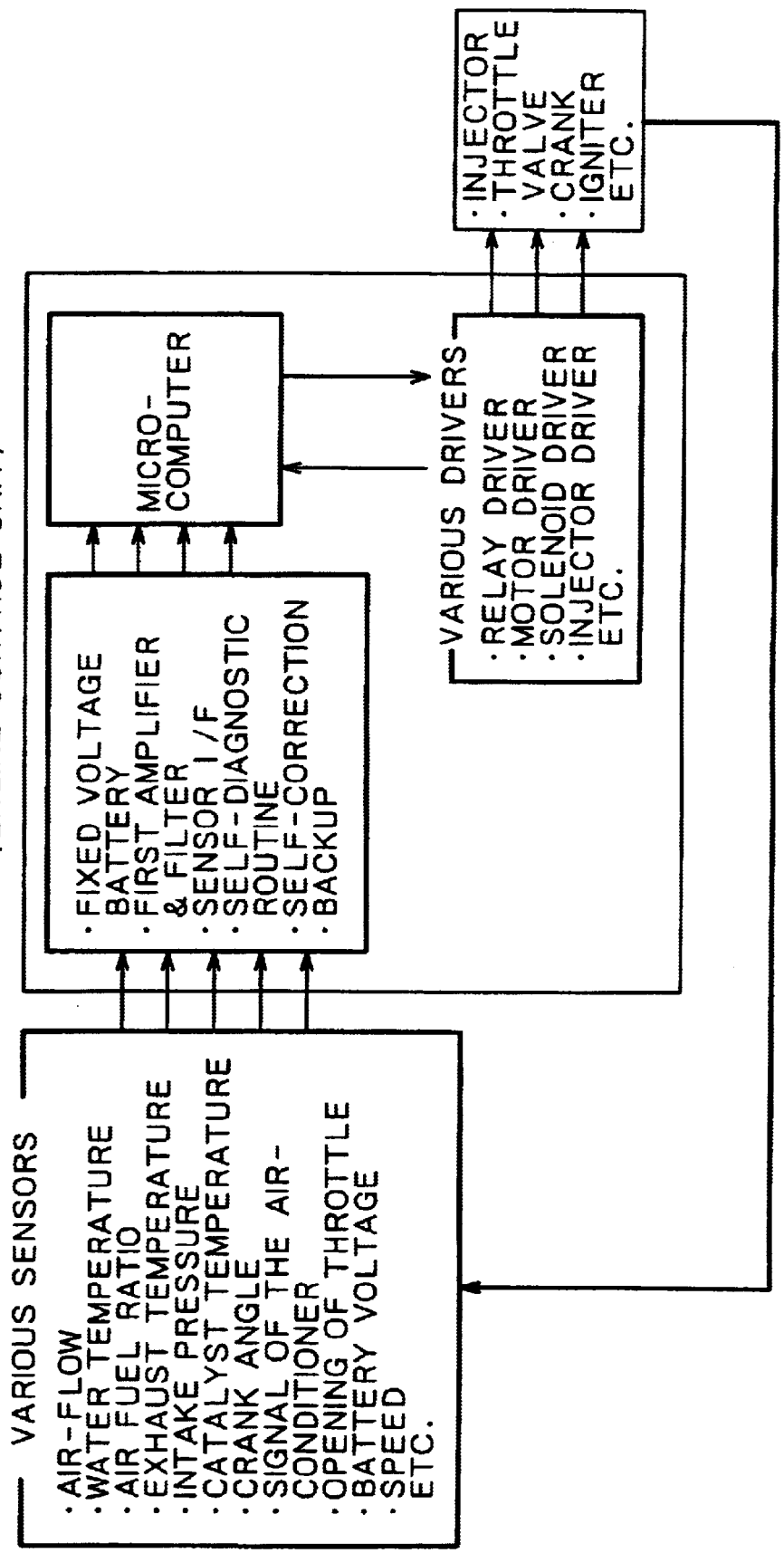

US 6,657,257 B2

INSULATED GATE FIELD EFFECT TRANSISTOR AND SEMICONDUCTOR INTEGRATED CIRCUIT

BACKGROUND OF THE INVENTION

In a conventional technology of an insulated gate field effect transistor, if the insulated gate field effect transistor is arranged to have an avalanche breakdown, i.e., an element withstand voltage when no voltage is applied to the gate electrode thereof, of more than 30 V, the following construction is employed. That is, for example, if the insulated gate field effect transistor is an N-type channel lateral MOS field effect transistor formed as an N-type substrate, as shown in FIG. 2, a silicon oxide film 12 is formed on an Si substrate 13 of N-type or P-type, an N-type Si substrate 11 is formed on the silicon oxide film 12, a source electrode 15 is provided on the N-type Si substrate, a high concentration N-type layer 61 and a high concentration P-type layer 71 are formed so as to contact to the source electrode 15, a combination of a gate oxide film 32 and a gate electrode 31 is provided so as to contact to the high concentration N-type layer 61, and a P-type region (p-body layer) 41 is formed so as to contact to the gate oxide film 32, the high concentration N-type layer 61 and the high concentration P-type layer 71. Further, a drain electrode 16 is provided at a lateral position with respect to the combination of the gate oxide film 32 and the gate electrode 31 through a field oxide film 21 contacting to the combination, and a high concentration N-type layer 62 is provided so as to contact to the drain electrode 16.

Conversely, if the insulated gate field effect transistor is formed as a P-type substrate, as shown in FIG. 3, the silicon oxide film 12 is formed on the Si substrate 13 of the N-type or P-type, a P-type Si substrate 19 is formed on the silicon oxide film 12, a source electrode 15 is provided on the P-type Si substrate 19, and the high concentration N-type layer 61 and the high concentration P-type layer 71 are formed so as to contact to the source electrode 15, the combination of the gate oxide film 32 and the gate electrode 31 is provided so as to contact to the high concentration N-type layer 61, and the P-type region (p-body layer) 41 is formed so as to contact to the gate oxide film 32, the high concentration N-type layer 61 and the high concentration P-type layer 71. Further, the drain electrode 16 is provided at a lateral position with respect to the combination of the gate oxide film 32 and the gate electrode 31 through the field oxide film 21 contacting to the combination, and the high concentration N-type layer 62 is provided so as to contact to the drain electrode 16. Furthermore, the P-type substrate 19 has an N-type region 101 formed so that the N-type region 101 is contacted to the gate oxide film 32, and extends to be contacted to the high concentration N-type layer 62 contacting to the drain electrode 16.

However, it is often requested that a so-called MOS field effect transistor can afford a withstand voltage, or the avalanche breakdown exceeding the rated voltage thereof, even if the MOS field effect transistor is placed in an on-state, e.g., the MOS field effect transistor is applied at its gate electrode with a voltage which exceeds the threshold voltage thereof. (The withstand voltage when the MOS field effect transistor is placed in the on-state is hereinafter referred to as on-breakdown.) However, if the N-type channel lateral MOS field effect transistor using the N-type substrate is fabricated as shown in FIG. 2 based on the conventional technology, on-breakdown exceeding the rated value cannot be guaranteed unless a sufficient distance is provided between the source electrode and the drain electrode. On the other hand, if the lateral size of the device is made large, the drain resistance also becomes large, with the result that the MOS field effect transistor suffers from deterioration in the on-resistance. This is undesirable matter for the MOS field effect transistor.

On the other hand, if the N-type channel lateral MOS field effect transistor is arranged as one employing the P-type substrate, it is allowable to make the on-breakdown greater than the rated value without increasing the distance between the source electrode and the drain electrode. However, in order to realize the N-type channel lateral MOS field effect transistor using the P-type substrate, it is indispensable to form a PN-junction between the P-type substrate and the N-type region 101 of the N-type channel lateral MOS field effect transistor. Which fact makes it difficult to fabricate a thin film transistor having an Si layer as the SOI substrate serving as a device formation area. The thickness of the Si layer of the SOI (Silicon On Insulator) substrate serving as the device formation area is deeply concerned with a problem of a time for forming a trench as a separation wall in a semiconductor device. That is, as the thickness of the Si layer becomes large, it takes a long time to form the trench, leading to lower throughput. Therefore, it is disadvantageous in terms of cost performance. Conversely, if any thin film technology is established for making thin the Si layer, which serves as the device formation area of the SOI substrate, then the following advantages can be expected. That is, it becomes allowable to bury a source region or a drain region in the Si substrate of a low-voltage CMOS device, which is driven at a low voltages such as 5 V, 3.3 V, 2.5 V to bring them into contact with an oxide film, together with any device having a high withstand voltage. In this way, since a parasitic capacitance of the source region and the drain region can be eliminated, it is expected to improve the performance of the CMOS device driven at a low voltage. However, if the device employs the P-type substrate, it will be difficult to improve the performance of the CMOS device driven at a low voltage.

Further, an N-type channel MOS field effect transistor using Si substrate, not SOI substrate, is widely utilized. However, if such device is utilized in a power IC which is often provided with a high withstand voltage device mounted thereon, a sufficient distance shall be required between each of the devices for avoiding undesirable operation in the transistor due to parasitic capacitance. Further, the above-described device has a relatively large leak current at a high temperature operation as compared with that of the device using the SOI substrate.

SUMMARY OF THE INVENTION

The present invention is made in view of the above aspect. Therefore, it is an object of the present invention to provide an insulated gate field effect transistor employing an SOI substrate in which it is possible to improve the on-breakdown of the transistor without increasing the size of the device.

According to an N-type insulated gate field effect transistor using an N-type SOI substrate as an Si layer serving as a device formation area of present invention, the SOI substrate is arranged to have an N-type semiconductor region (n-body layer), which has an impurity concentration higher than the impurity concentration of the N-type Si layer serving as the device formation area of the SOI substrate, so that the N-type semiconductor region is contacted to a part of the gate oxide film and the field silicon oxide film formed between the source electrode and the drain electrode and extends to be contacted to an N-type diffusion layer contacted to the drain electrode. With this arrangement, the on-breakdown will be remarkably improved.

Initially, conditions influential in determining the on-breakdown will be described. The on-breakdown is a withstand voltage at which current is abruptly flowed from a saturation region in a chart descriptive of a drain voltage to drain current characteristic when a MOS field effect transistor having an N-type channel formed therein is applied with a positive voltage at its gate electrode and hence the MOS field effect transistor is placed in an on-state. When a channel is formed, electrons are flowed from the source region through the channel region to the drain region. When electrons are flowed into the drain region, a number of holes are also created so as to neutralize the electrons. The holes created at this time are diffused into the drain region as the electrons are flowed. Further, if the magnitude of the drain current becomes large, the number of electrons are also increased, and the number of holes are also increased. If the holes reach the high concentration N-type layer contacting to the drain electrode, the holes are locally accumulated. At this time, since the electric field intensity at the end of the high concentration N-type layer is abruptly increased, creation of a pair of electron and hole is further promoted in the electric field. If the intensity of the electric field makes the drain voltage exceed a certain value, the current abruptly starts to flow in a manner described above.

According to the structure of the N-type insulated gate field effect transistor of aspects of the present invention, there is provided an N-type region (n-body layer) of which impurity concentration is higher than that of the substrate, in a region where the electron current enters upon flowing from the channel region to the drain region. Therefore, the drain resistance becomes lowered and the voltage drop thereof will be made small. Since the N-type region (n-body layer) has an impurity concentration higher than of the substrate, the electric field intensity at the drain region becomes large, and hence holes deriving from the moving of electrons are suppressed from diffusion into the drain electrode. For this reason, the holes can be prevented from being diffused toward the drain electrode side until a voltage higher than the withstand voltage of the conventional insulated gate field effect transistor is applied. Accordingly, the on-breakdown will be remarkably improved.

The present invention can be also applied to a P-type insulated gate field effect transistor. In this case, the conductivity type for each semiconductor layer is defined as reverse of in the case of applying the N-type insulated gate field effect transistor. Further, other insulating film such as a nitride film may be used instead of the gate oxide film, the field oxide film and the oxide film in the SOI substrate.

BRIEF DESCRIPTION OF THE DRAWINGS

The above and other objects, features and advantages of the present invention will become apparent from the following description with reference to the accompanying drawings which illustrate examples of the present invention.

FIG. 17 is a block diagram of an engine control unit in which an N-type channel lateral MOS field effect transistor having a high withstand voltage according to a thirteenth embodiment of the present invention is suitably employed.

DETAILED DESCRIPTION OF THE PREFERRED EMBODIMENTS

Several embodiments of the present invention will be hereinafter described with reference to the attached drawings.

Embodiment 1

Figure 1:
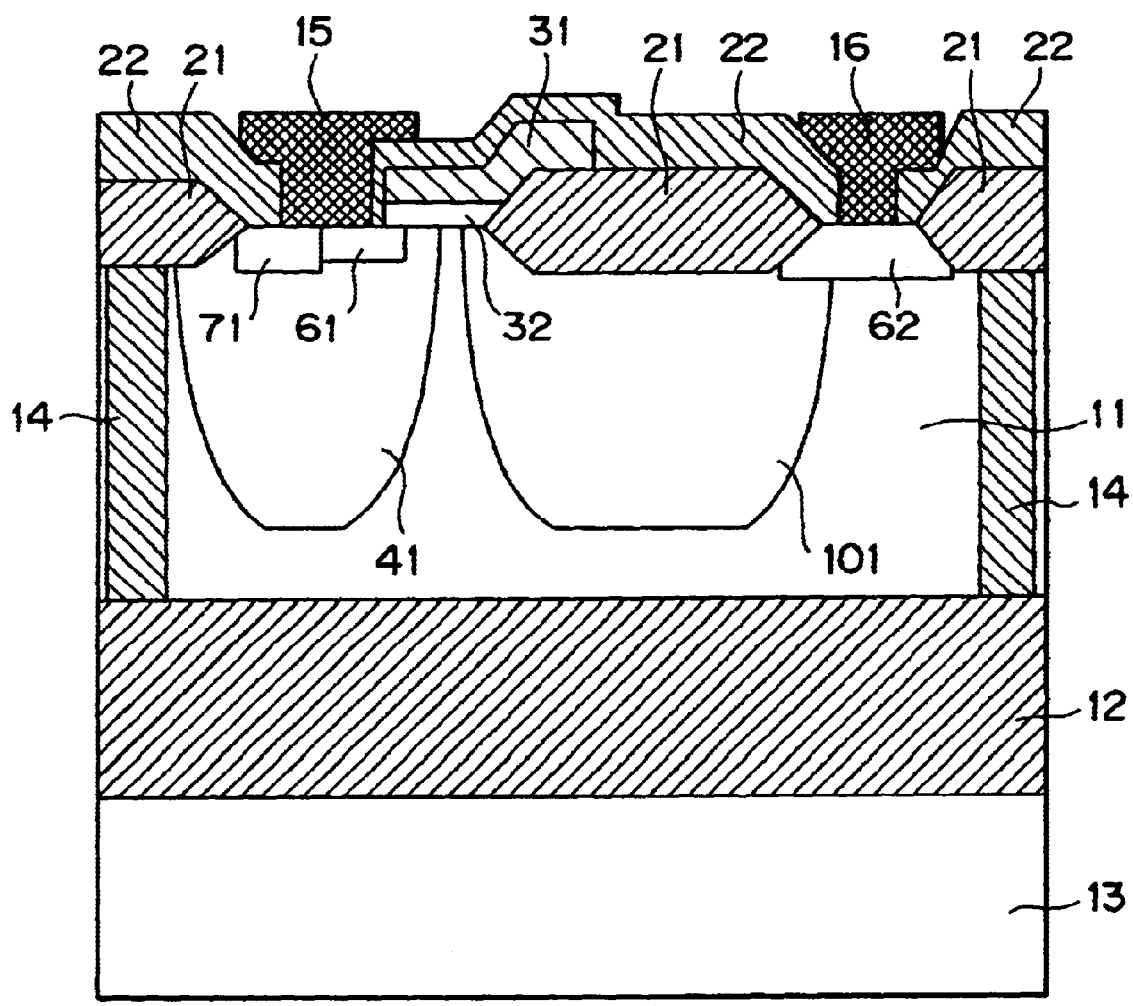
FIG. 1 is a cross-sectional view of an N-type channel lateral MOS field effect transistor having a high withstand voltage according to a first embodiment of the present invention.
Figure 2:
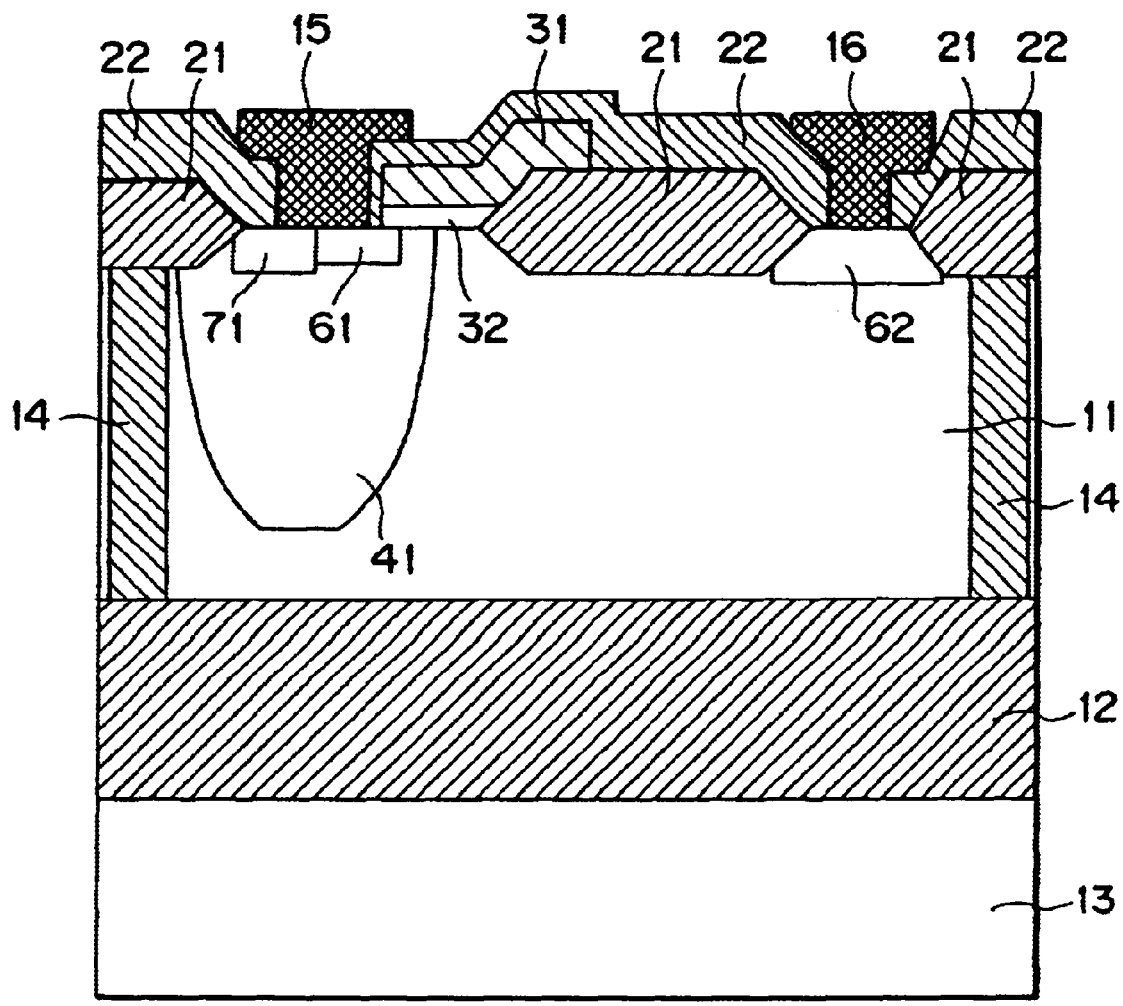
FIG. 2 is a cross-sectional view of an N-type channel lateral MOS field effect transistor having a high withstand voltage built on an N-type SOI substrate based on a conventional technology.
Figure 3:
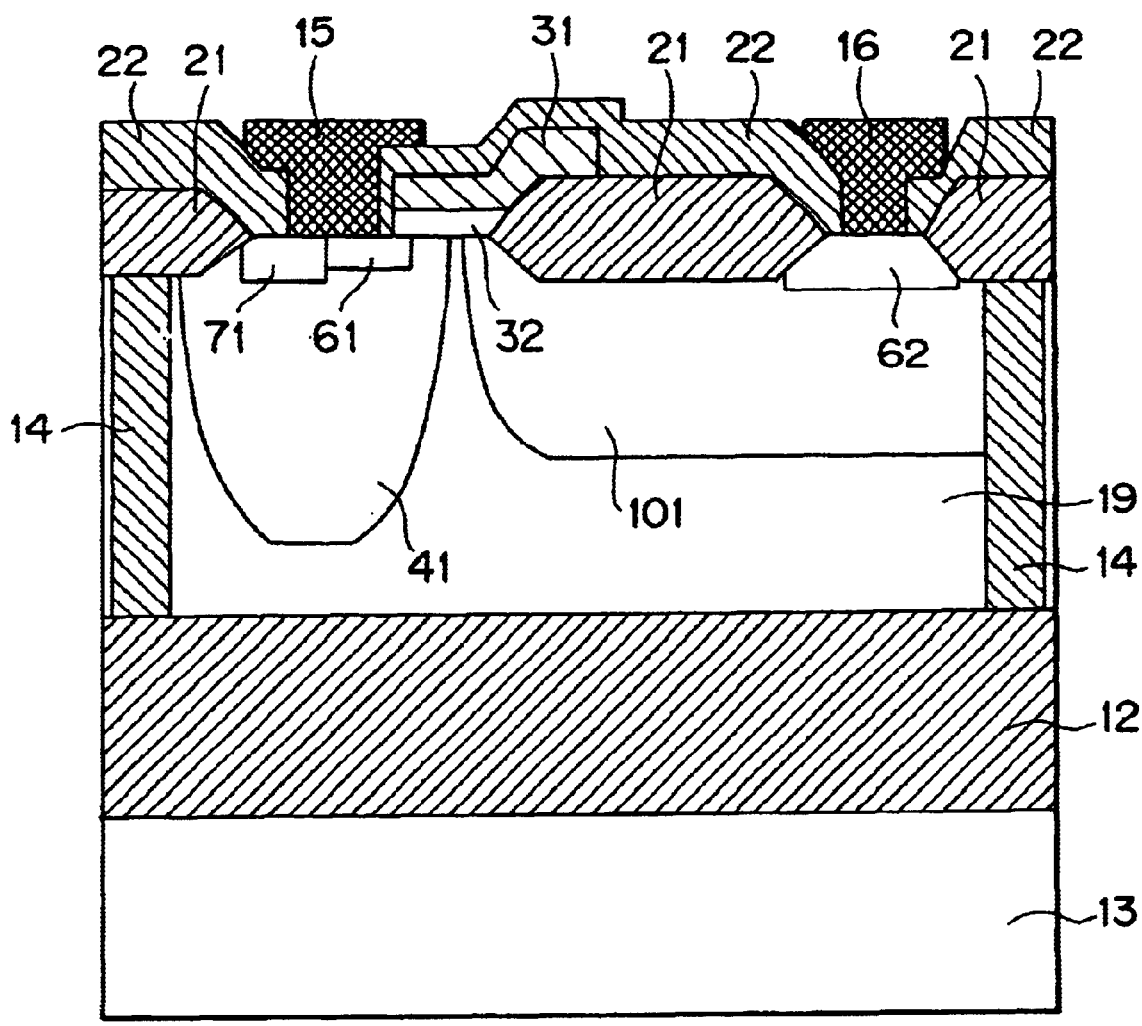
FIG. 3 is a cross-sectional view of an N-type channel lateral MOS field effect transistor having a high withstand voltage built on a P-type SOI substrate based on a conventional technology.

FIG. 1 is a diagram showing a cross-sectional structure of an N-type channel lateral MOS field effect transistor as a first embodiment of the present invention. As shown in FIG. 1, the structure of the embodiment 1 includes an Si substrate 13 of an N-type having phosphorous doped therein or of a P-type having boron doped therein. A silicon oxide film 12 is formed on the Si substrate 13, and an N-type Si substrate 11 having phosphorus doped therein is provided on the silicon oxide film 12. Further, on the Si substrate 11, there are provided a field silicon oxide film 21, an interlayer insulating film 22, N-type high concentration diffusion layers 61 and 62 having arsenic or phosphorous doped therein, and a P-type high concentration diffusion layer 71 having boron doped therein. Further, a source electrode 15 formed of a metal film of which principal components are aluminum or tungsten is provided so as to contact to the N-type diffusion layer 61 and the P-type diffusion layer 71. The N-type Si substrate 11 is made to have a P-type region 41 (p-body layer) having boron doped therein so as to contact to the N-type diffusion layer 61 and the P-type diffusion layer 71. On the N-type Si substrate 11, there is also provided a gate silicon oxide film 32 so as to contact to the N-type diffusion layer 61, which is contacted to the source electrode 15, and the P-type region 41. A gate electrode 31 having polycrystalline silicon or any metal as a principal component contained therein is provided so as to contact to the gate silicon oxide film 32. A drain electrode 16 formed of a metal film of which principal components are aluminum, tungsten or the like is provided so as to contact to the N-type diffusion layer 62. Furthermore, the N-type Si substrate 11 is made to have an N-type diffusion region 101 (n-body layer) having phosphorous doped therein so that the diffusion region 101 is contacted to the gate silicon oxide film 32, the field silicon oxide film 21 which is provided between the source electrode 15 and the drain electrode 16, and the N-type diffusion layer 62 which is contacted to the drain electrode 16.

The N-type high concentration diffusion layer 62 is partially contacted to the N-type diffusion region 101, and also contacted to the N-type Si substrate 11. Owing to the N-type diffusion region 101, the resistance of the drain region of the lateral MOS field effect transistor is lowered. Thus, the voltage drop in the drain region can be suppressed to be low, and the electric field at the vicinity of the entrance portion of the drain region contacting to the gate oxide film 32 is intensified. For this reason, an inversion layer is created in the P-type region 41 and a channel is formed. Accordingly, when holes are created as electrons are flowed into the drain region, more voltage is required for the holes to reach the N-type high concentration diffusion layer 62 contacting to the drain electrode 16. Which fact means that the on-breakdown becomes high.

According to the structure of the embodiment 1, the P-type region 41 contacting to the gate oxide film 32 is separated from the N-type diffusion region 101, and there is formed a region of which impurity concentration is equal to that of the substrate 11 below the gate oxide film 32. Of course, the P-type region 41 may be brought into contact with the N-type region 101 at a region below the gate oxide film 32. In this case, the N-type lateral MOS field effect transistor may be formed as one having a relatively low on-breakdown, e.g., about 30 V to 50 V. If the N-type lateral MOS field effect transistor is requested to have an on-breakdown higher than that on-breakdown, it is necessary to provide a region of which impurity concentration is equal to that of the Si substrate 11 below the gate oxide film 32, as the present embodiment 1.

Embodiment 2

Figure 4:
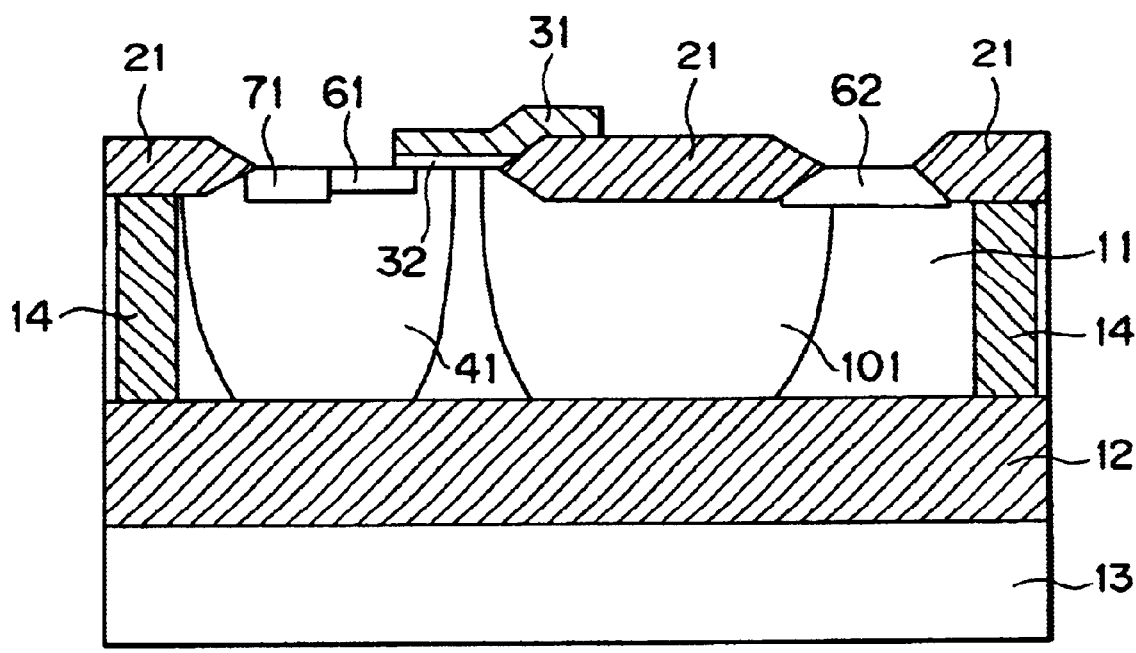
FIG. 4 is a cross-sectional view of an N-type channel lateral MOS field effect transistor having a high withstand voltage according to a second embodiment of the present invention.

FIG. 4 is a diagram showing a cross-sectional structure of an N-type channel lateral MOS field effect transistor as a second embodiment of the present invention. This arrangement is different from that of the embodiment 1 in that the P-type region 41 extends to be contacted to the buried oxide film 12.

The device fabricated on the SOI substrate is wholly surrounded with an insulating film. However, the insulating film also serves as a condenser (capacitor). Thus, when noise is applied from the outside of the insulating film, the noise can propagate through the condenser to the interior of the device. That is, if C is taken as the capacitance of the buried oxide film 12 and a potential of any point is changed by dv during a time duration dt due to the noise, a current flowing into the device is expressed as C(dv/dt). Thus, an electric current is flowed into the source electrode and the drain electrode in accordance with a capacitance ratio of the source and the drain electrode. This kind of displacement current is inevitable particularly in a switching circuit or the like having an inductive load. If a condenser is provided between the drain electrode and the gate electrode of the next stage MOS field effect transistor, the noise component can be suppressed and the MOS field effect transistor in the next stage can be protected from erroneous operation.

Figure 5A:
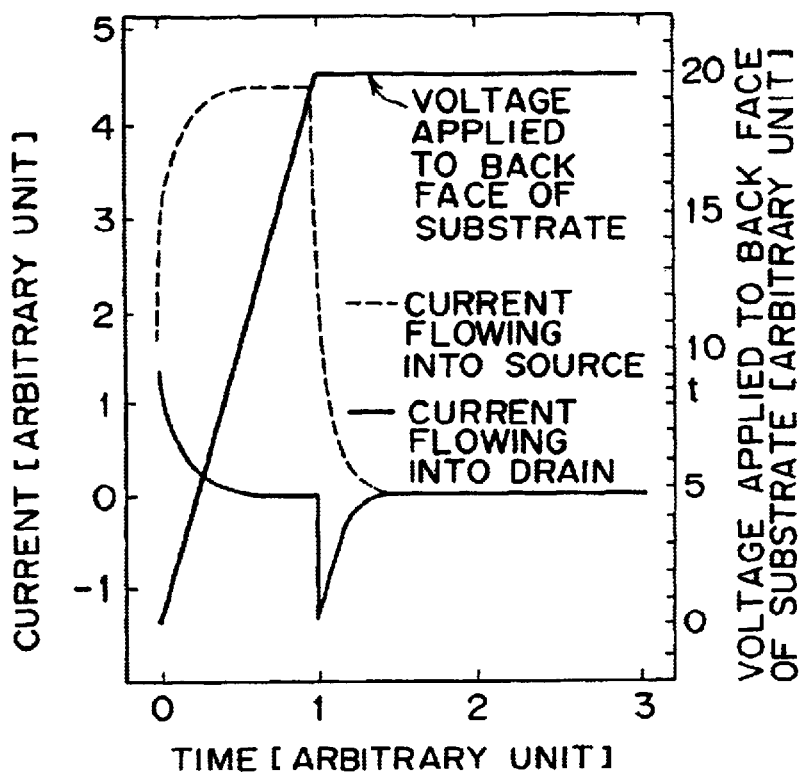
FIGS. 5a and 5b are diagrams illustrative of how noise attenuation is effected on the N-type channel lateral MOS field effect transistor having the high withstand voltage according to the second embodiment of the present invention.
Figure 5B:
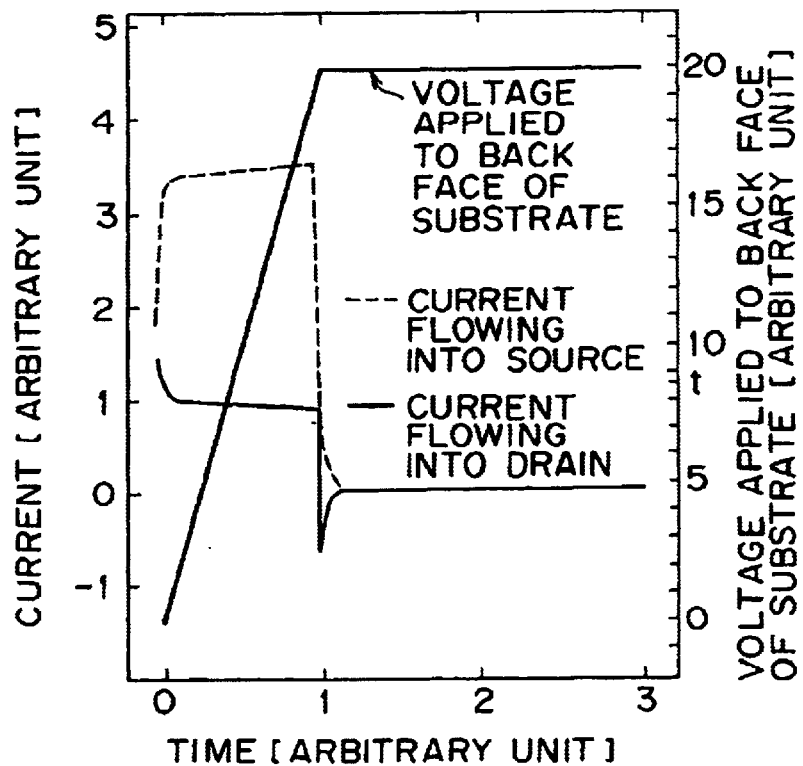

In this case, if the current component flowing into the drain region is made small, the size of the condenser interposed between the drain electrode and the gate electrode of the next stage MOS field effect transistor can be also made small. Therefore, the size of the chip in which the device is fabricated can be made small. FIGS. 5a and 5b are diagrams for showing an element structure of the embodiment 2 and the embodiment 1, and also for showing the result of calculation done as a computer simulation on the current flowing in the source region and the drain region when a voltage of 20 kV/μ sec is applied to the back face of the support substrate side of the SIO substrate. FIG. 5a shows the result of simulation done on the element structure of the embodiment 2, and FIG. 5b shows the result of simulation done on the element structure of the embodiment 1. As is understood from FIGS. 5a and 5b, for the element structure, the current flowing into the drain region of the embodiment 1 is smaller than the current flowing into the drain region of the embodiment 2. This is because the P-type region 41 formed below the source electrode 15 is brought into contact with the buried oxide film 12, and hence the capacitance C deriving from the source region and the buried oxide film 12 are directly coupled to each other. Therefore, the current flowing into the source region is increased, and the current flowing into the drain region is decreased, correspondingly. In an ordinary case, since the source potential is grounded, no influence will be caused even if the flowing current is increased.

Embodiment 3

Figure 6A:
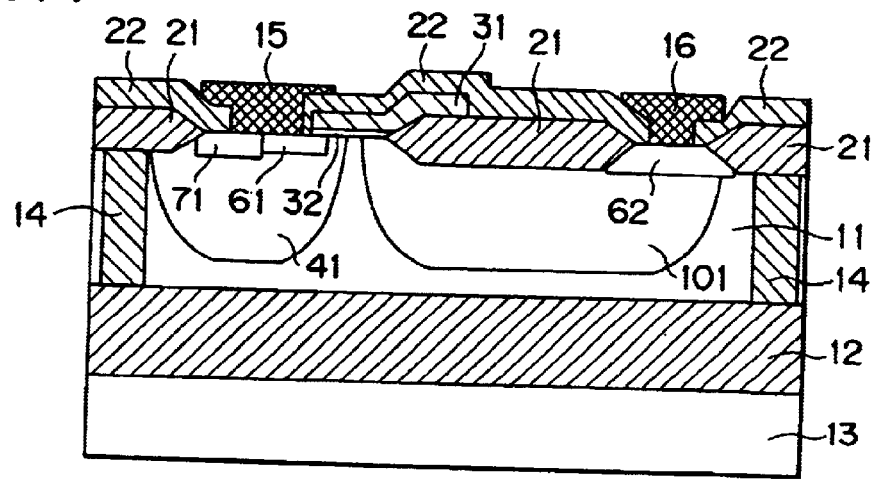
FIGS. 6a to 6c are diagrams each showing a cross-sectional view of an N-type channel lateral MOS field effect transistor having a high withstand voltage according to a third embodiment of the present invention.

FIG. 6a is a diagram showing a cross-sectional structure of an N-type channel lateral MOS field effect transistor as an embodiment 3 of the present invention. The structure thereof is different from that of the embodiment 1 in the following point. That is, the N-type region 101 contacting to the gate oxide film 32 and provided beneath the field silicon oxide film 21 between the source electrode 15 and the drain electrode 16, extends to involve the high concentration N-type diffusion layer 62 which is contacting to the drain electrode 16. In other words, the configuration of the high concentration N-type diffusion layer 62 projected on a plan view is wholly surrounded with the N-type region 101. If the high concentration N-type diffusion layer 62 is disposed so as to be involved in the N-type region 101, then the drain resistance will be further decreased, the on-breakdown will be increased and on-resistance will be lowered.

Figure 6B:
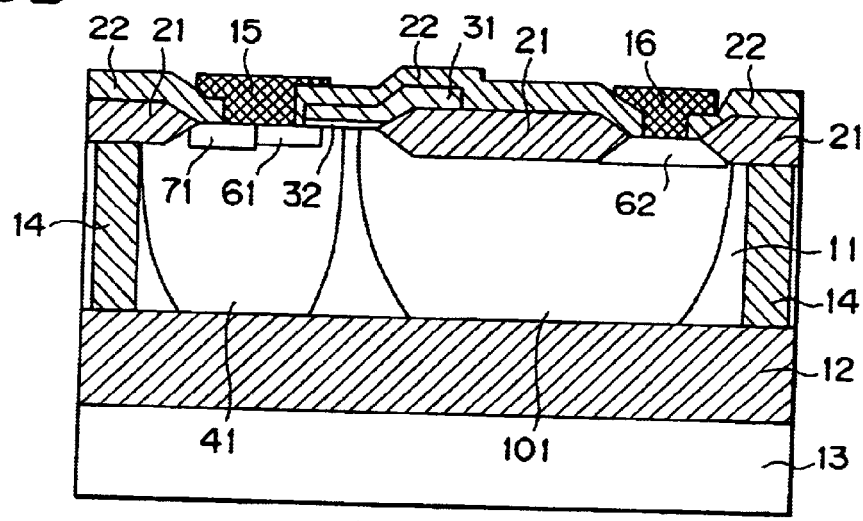

Further, when any circuit having inductive load such as a switching circuit is to be fabricated on the substrate, if the P-type region 41 is formed so as to contact to the buried oxide film 12 as shown in FIG. 6b, similarly to the case of embodiment 2, it becomes possible to lessen the amount of displacement current propagating from the outside through the buried oxide film 12 and appearing as the drain current.

Figure 6C:
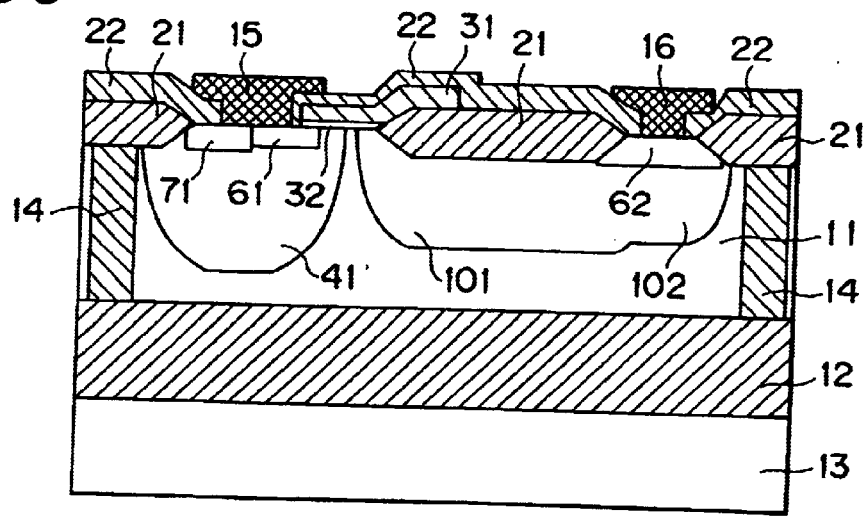

Further, the N-type region 101 need not have a single layer structure. That is, as shown in FIG. 6c, the N-type region may have a two-layer structure composed of an N-type region 101 provided beneath the field silicon oxide film 21 and an N-type region 102 provided beneath the high concentration diffusion layer 62. Also in this structure, the drain resistance is decreased, and hence the on-breakdown can be increased and on-resistance can be lowered.

Embodiment 4

Figure 7:
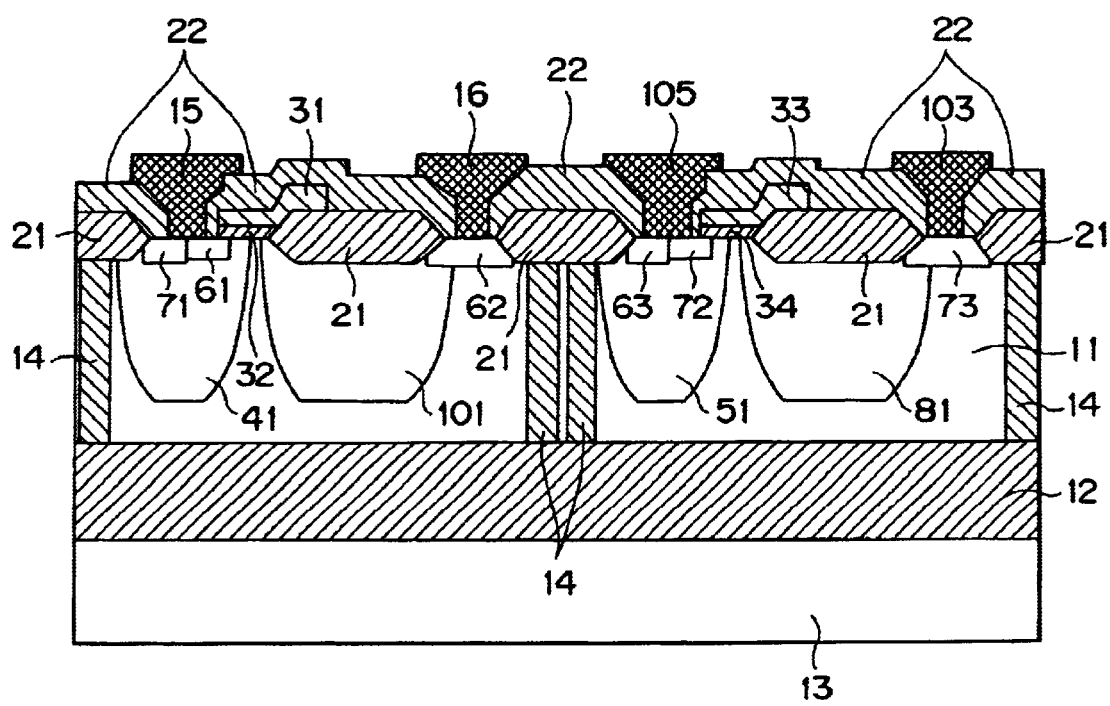
FIG. 7 is a cross-sectional view of a fourth embodiment of the present invention in which an N-type channel lateral MOS field effect transistor having a high withstand voltage and a P-type channel lateral MOS field effect transistor having a high withstand voltage are provided in a mixed fashion.

FIG. 7 is a diagram showing a part of a semiconductor integrated circuit as a fourth embodiment of the present invention in which N-type channel lateral MOS field effect transistor and a P-type channel lateral field effect transistor are fabricated.

According to the structure of the semiconductor integrated circuit of the present embodiment, in addition to the structural component of the N-type channel lateral MOS field effect transistor of the embodiment 1, there is provided a P-type channel lateral MOS field effect transistor. The P-type channel lateral MOS field effect transistor is arranged to include a source electrode 105 and a high concentration P-type diffusion layer 72 and a high concentration N-type diffusion layer 63 contacting to the source electrode 105. Further, an N-type region 51 is formed so as to contact to the high concentration P-type diffusion layer 72 and the high concentration N-type diffusion layer 63. A gate oxide film 34 is provided so as to contact to the high concentration P-type diffusion layer 72 and the N-type region 51. The field silicon oxide film 21 is also provided between the source electrode 105 and a drain electrode 103. Further, the substrate 11 has a P-type region 81 beneath the field silicon oxide film 21 so as to contact to the gate oxide film 34 and a high concentration P-type layer 73 which is contacted to the drain electrode 103 so that the P-type region 81 has a depth allowable to form a PN-junction together with the substrate 11. The P-type channel lateral MOS transistor has a so-called RESURF structure. When a drain voltage is applied, a depletion layer is widened in the PN-junction between the P-type region 81 and the N-type substrate 11, with the result that the electric field is relaxed and the withstand voltage is increased. According to the arrangement of the embodiment 4, a CMOS device having a high on-breakdown can be fabricated on the N-type substrate 11 i.e., the SOI substrate.

Embodiment 5

Figure 8:
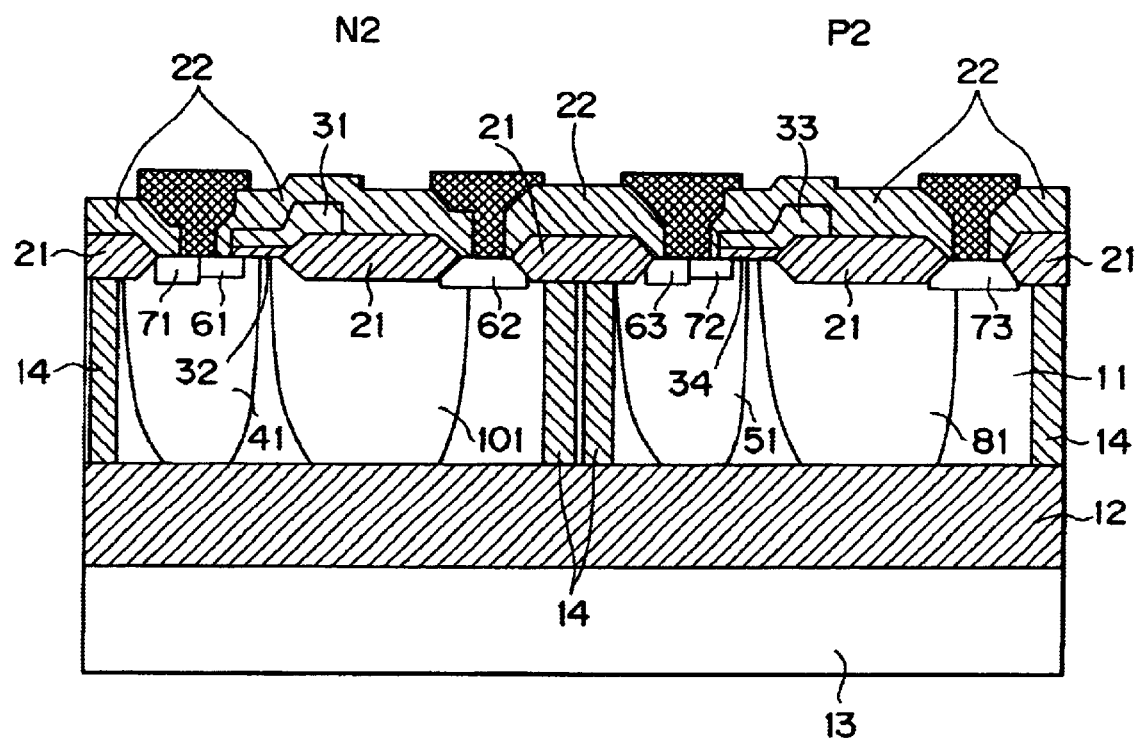
FIG. 8 is a cross-sectional view of a fifth embodiment of the present invention in which an N-type channel lateral MOS field effect transistor having a high withstand voltage and a P-type channel lateral MOS field effect transistor having a high withstand voltage are provided in a mixed fashion.

FIG. 8 is a diagram showing a part of a semiconductor integrated circuit as a fifth embodiment of the present invention in which N-type channel lateral MOS field effect transistor having a high withstand voltage (N2) and a P-type channel lateral MOS field effect transistor (P2) are fabricated. Unlike the embodiment 4, the P-type region 41 and the N-type region 101 of the N-type channel lateral MOS field effect transistor, and the N-type region 51 and the P-type region 81 of the P-type channel lateral field effect transistor are made to reach the buried oxide film 12. As explained in the description of the embodiment 2, when a circuit having inductive load such as a switching circuit is fabricated, in order to avoid erroneous operation due to the displacement current, it is effective to bring the P-type region 41 into contact to the buried oxide film 12. Also in the P-type channel MOS field effect transistor, if the N-type region 51 is brought into contact with the buried oxide film 12, the displacement current due to the external noise flowing into the source electrode will be increased. Therefore, anti-noise performance of the P-type channel lateral MOS field effect transistor P2 is improved. As a result, it becomes possible to fabricate a CMOS device with a superior anti-noise performance on the SOI substrate.

Embodiment 6

Figure 9A:
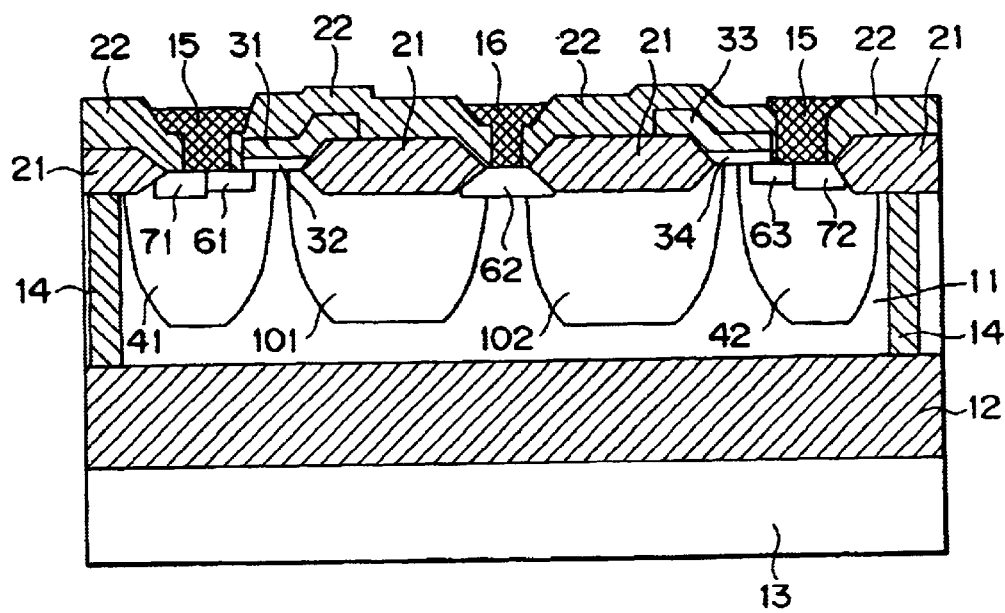
FIGS. 9a and 9b are diagrams each showing a cross-sectional view of an N-type channel lateral MOS field effect transistor having a high withstand voltage according to a sixth embodiment of the present invention.

FIG. 9a is a diagram showing a cross-sectional view of an N-type channel lateral MOS field effect transistor as an embodiment 6 of the present invention. Ordinarily, a MOS field effect transistor having a high withstand voltage is requested to have a high current driving performance. To this end, the structure of this MOS field effect transistor is elongated in the depth direction with respect to the lateral direction in the cross-section of FIG. 8 so as to increase the current driving performance. However, if the MOS field effect transistor is elongated in the depth direction, the shape of the chip on which the transistors are fabricated is also elongated. Accordingly, the number of chips obtained from a single sheet of round semiconductor wafer is decreased. Therefore, according to the present embodiment, of course the shape of the high withstand voltage MOS transistor is elongated in the depth direction, it is also elongated in the lateral direction thereof. Then, the number of source electrodes and drain electrodes is increased and the source electrodes and the drain electrodes are alternately disposed until the device acquires a necessary level of current driving performance.

According to the structure of the present embodiment, the source electrode 15 is disposed near a trench filled with an insulating layer 14. The N-type channel lateral MOS field effect transistor is utilized under the condition that the gate electrode is applied with a voltage while the drain electrode is also applied with a voltage, and the source electrode is grounded. In the device using the SOI substrate, the outside of the device formation area, which is surrounded with trenches, is brought into a grounded state. If a drain electrode is disposed near the trench, a potential curve deriving from the voltage applied to the drain electrode will overlie on the trench. For example, if the trench is filled with a silicon oxide film and polycrystalline silicon, since polycrystalline silicon has greater tendency in oxidation than the silicon oxide film during the following processes, the trench suffers from much mechanical stress at the upper portion thereof. As a result, if a voltage of about 500 V, for example, is applied to the drain electrode which is located near the trench, the trench is partly influenced from the potential deriving from the voltage applied to the drain electrode. Which fact can cause disruption of the insulating film. According to the structure of the present embodiment, trenches are provided near the source electrode not near the drain electrode. Therefore, the insulating film provided in the trench can be protected from disruption.

Furthermore, in a case where a circuit having inductive load such as switching circuit is fabricated, a displacement current due to noise will cause a problem. However, according to the structure of the present embodiment, the electrode provided near the trench is not the drain electrode but the source electrode. Therefore, even if the noise propagates through the capacitance formed of the trench filled with the insulating film into the device formation area, the displacement current can be received by the source region. Accordingly, it is possible to avoid erroneous operation due to the displacement current.

Figure 9B:
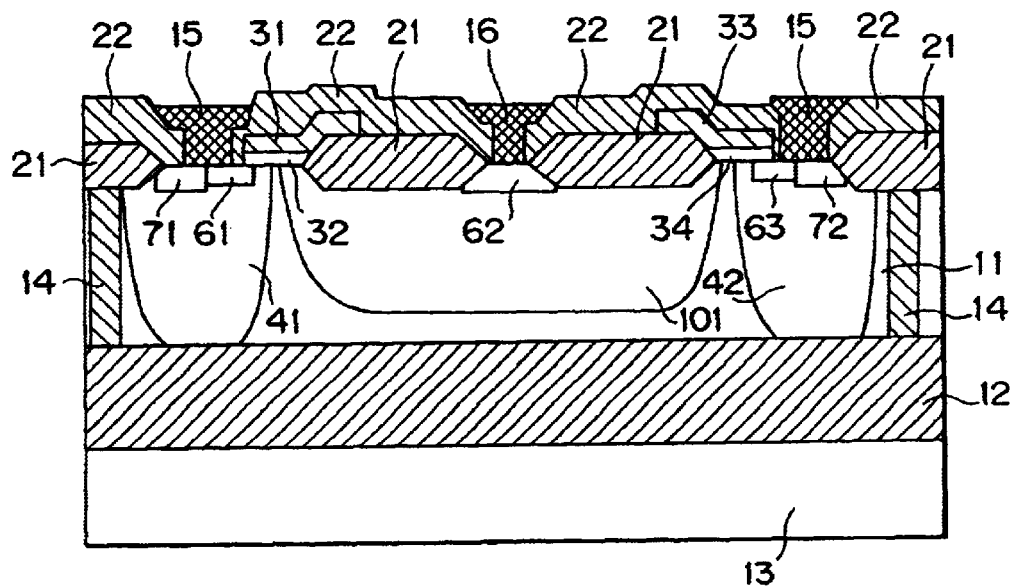

Further, as shown in FIG. 9b, if the high concentration N-type diffusion layer 62 contacting to the drain electrode 16 is disposed in the N-type region 101, the drain resistance will be decreased and the on-resistance will be increased, correspondingly. Furthermore, similarly to the embodiment 2, if the P-type regions 41 and 42 are formed so as to contact to the buried oxide film 12, it becomes possible to expect an advantage in avoiding erroneous operation due to the above-described displacement current.

Embodiment 7

Figure 10:
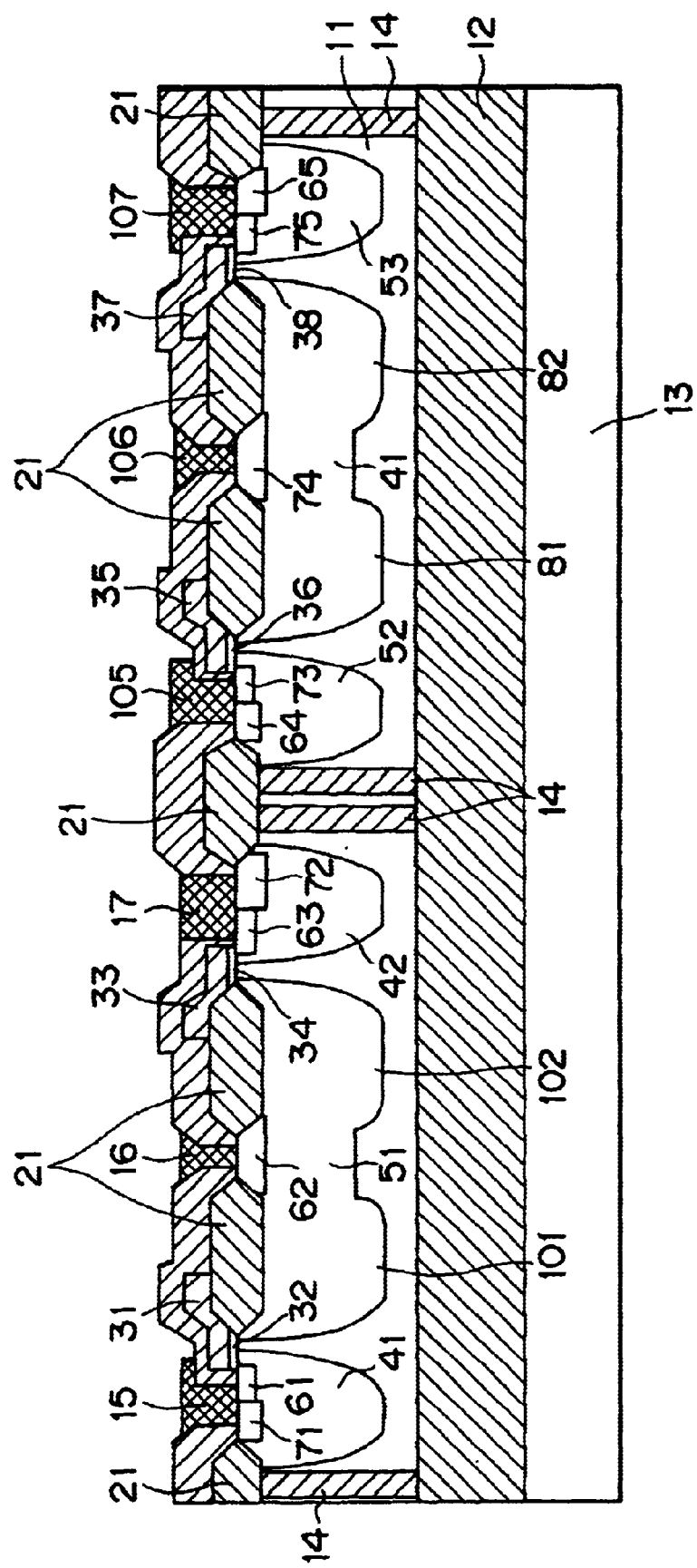
FIG. 10 is a cross-sectional view of a part of a semiconductor integrated circuit according to a seventh embodiment of the present invention in which an N-type channel lateral MOS field effect transistor having a high withstand voltage and a P-type channel lateral MOS field effect transistor having a high withstand voltage are fabricated.

FIG. 10 is a diagram showing a part of a semiconductor integrated circuit as a seventh embodiment of the present invention in which an N-type channel lateral MOS field effect transistor and a P-type channel lateral MOS field effect transistor are fabricated. The N-type channel lateral MOS field effect transistor of the embodiment 7 includes the drain electrode 16 similar to that of the N-type channel lateral MOS field effect transistor shown in the embodiment 6 and the high concentration N-type diffusion layer 62 contacting to the drain electrode 16. Also, the N-type channel lateral MOS field effect transistor of the embodiment 7 includes an N-type region 51, which is formed in the same process as that of the N-type regions 52 and 53 of the P-type channel lateral MOS field effect transistor, so as to contact to the high concentration N-type diffusion layer 62. Further, although the P-type channel lateral MOS field effect transistor has a RESURF structure, there is provided a source electrode 107 near the trench. Also in the structure of the present embodiment, the electrode provided near the trench is not the drain electrode but the source electrode. Therefore, it is possible to avoid erroneous operation due to the displacement current.

As shown in FIG. 10, the P-type regions 41 and 42 as a source region of the N-type channel lateral MOS field effect transistor and/or the P-type channel lateral MOS field effect transistor and the N-type regions 52 and 53 are made to contact to the buried oxide film 21. Therefore, it becomes possible to suppress the influence from the displacement current. Moreover, no problem will be caused by the structure that the N-type regions 101 and 102 and P-type regions 81 and 82 are contacted to the buried oxide film 21.

Embodiment 8

Figure 11:
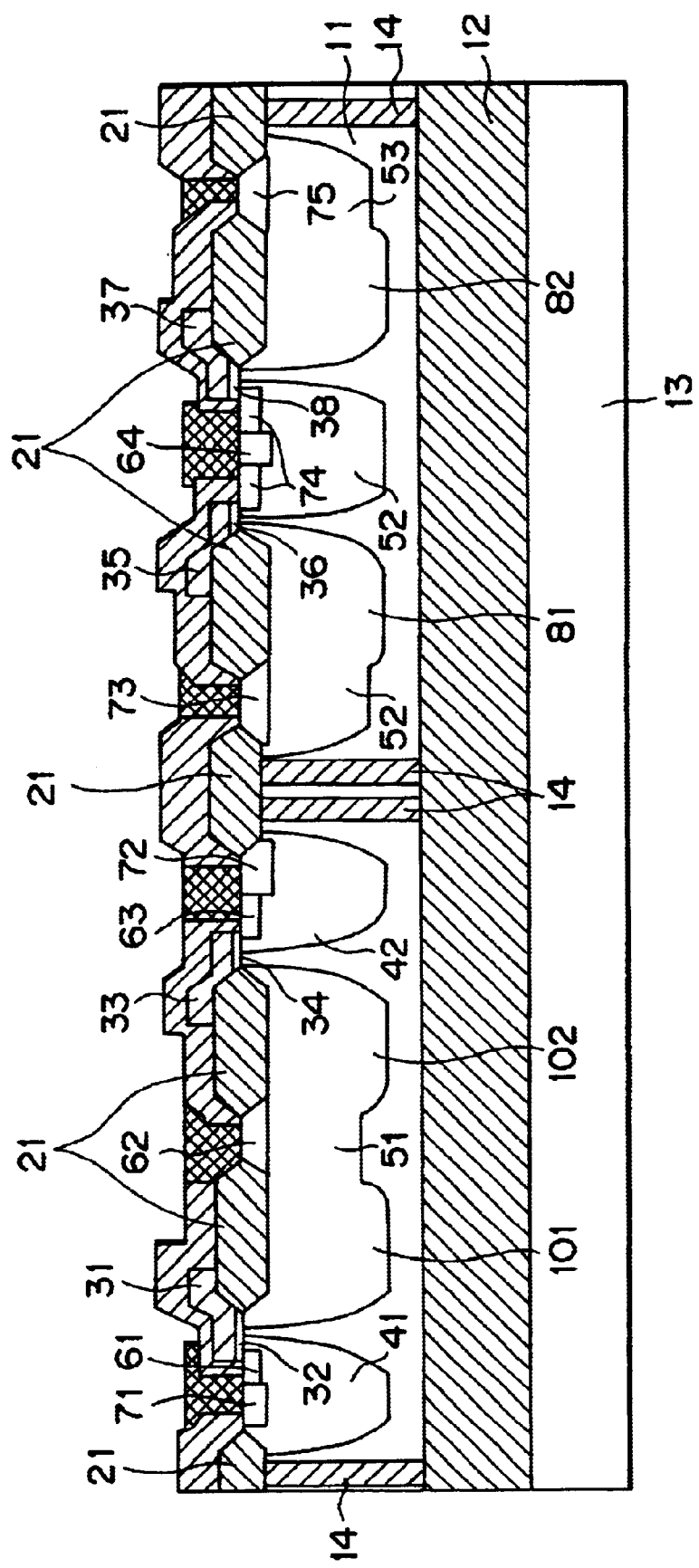
FIG. 11 is a cross-sectional view of a part of a semiconductor integrated circuit according to an eighth embodiment of the present invention in which an N-type channel lateral MOS field effect transistor having a high withstand voltage and a P-type channel lateral MOS field effect transistor having a high withstand voltage are fabricated.

FIG. 11 is a diagram showing a part of a semiconductor integrated circuit as an eighth embodiment of the present invention in which N-type channel lateral MOS field effect transistor and a P-type channel lateral MOS field effect transistor are fabricated. The N-type channel lateral MOS field effect transistor of the eighth embodiment has the same structure as that of the embodiment 7.

Although the P-type lateral MOS field effect transistor has a RESURF structure, there is provided a drain electrode near the trench. In a general operation mode of the P-type lateral MOS field effect transistor, the source electrode and the gate electrode are applied with a voltage. The source potential is kept high, and the drain electrode takes any arbitrary potential ranging from the ground level to a high potential. For this reason, even if a high voltage is applied to the source electrode and the drain electrode, since the electrode provided near the trench is not the source electrode but the drain electrode, the trench can be free from voltage application when the drain electrode takes the ground potential. If the semiconductor integrated circuit is utilized under an environment in which the displacement current due to external noise is not considered as a problem, as shown in FIG. 11 of the present embodiment, the P-type lateral MOS field effect transistor may take an arrangement in which the electrode provided near the trench is not the source electrode but the drain electrode.

Further, similarly to the structure of the embodiment 7, the P-type regions 41 and 42 and the N-type regions 52 and 53 may be contacted to the buried oxide film 21. Also, the N-type regions 101 and 102 and P-type regions 81 and 82 may be contacted to the buried oxide film 21.

Embodiment 9

Figure 12A:
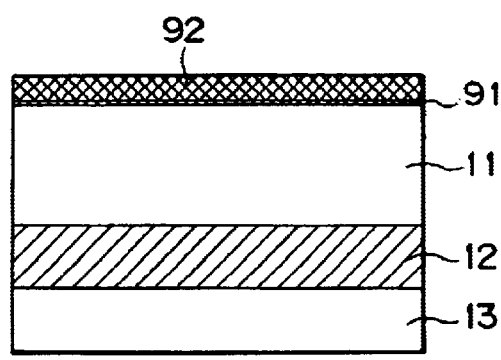
FIGS. 12a to 12h are diagrams for explaining steps of fabricating the N-type channel lateral MOS field effect transistor having a high withstand voltage as a ninth embodiment of the present invention.
Figure 12B:
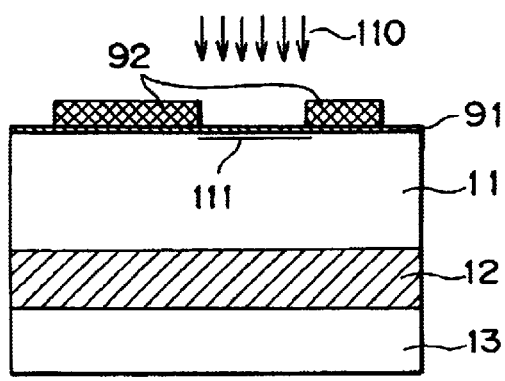

FIGS. 12a to 12h and FIGS. 13a to 13c are diagrams each showing a step of fabricating the N-type channel lateral MOS field effect transistor as the first embodiment of the present invention. Initially, as shown in FIG. 12a, a silicon oxide film 12 is formed on an N-type or a P-type Si substrate 13. Then, an Si substrate 11 is deposited on the silicon oxide film 12, and a silicon oxide film 91 having a thickness of 50 nm to 600 nm is grown on the N-type Si substrate 11 by using thermal oxidation method or the like. Then, a silicon nitride film 92 of 50 nm to 600 nm is deposited on the silicon oxide film 91 by using CVD method. Thereafter, as shown in FIG. 12b, the silicon nitride film 92 is partly removed. A place on which the silicon nitride film 92 is left not removed functions as a device formation area, or a so-called active region.

Figure 12C:
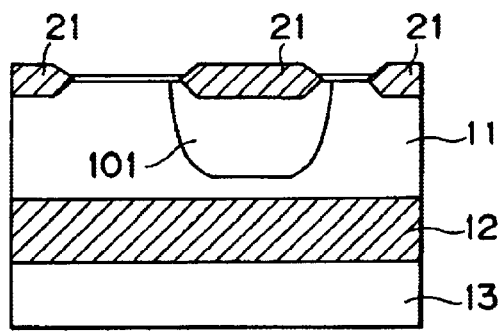

At this time, a resist or the like is introduced as a mask, and an N-type impurity ion beam 110 such as phosphorous is applied for carrying out ion implantation at an energy level of about 50 keV to 60 keV so that a dose amount of $1 \times 10^{12}/cm^2$ to $1 \times 10^{13}/cm^2$ is implanted. Thus, an N-type impurity layer 111 is formed. At this time, as shown in FIG. 12c, oxidation is effected at a temperature of about 900° C. to 1100° C. to form a field oxide film 21 having a thickness of 500 nm to 2000 nm. Thereafter, the silicon nitride film 92 is removed. At this time, the N-type impurity layer 111 formed at the process of FIG. 12b is diffused, whereby the N-type region 101 is formed beneath the field oxide film 21.

Figure 12D:
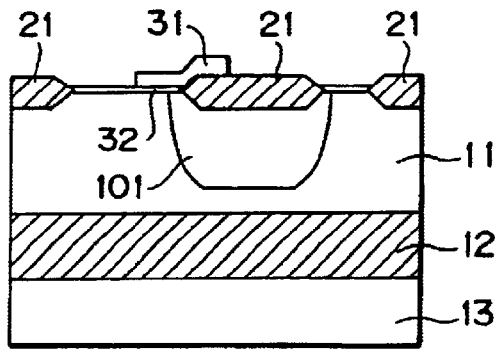
Figure 12E:
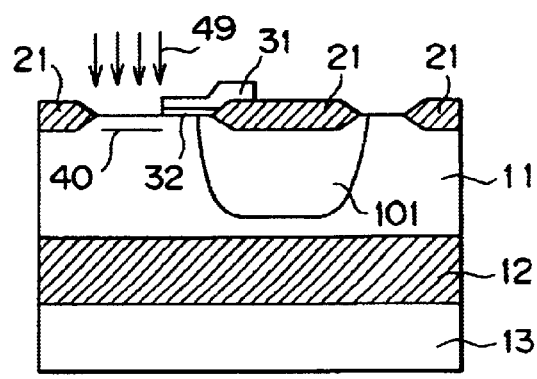

As shown in FIG. 12d, an oxide film is formed to have a thickness of about 5 nm to 100 nm. Thereafter, polycrystalline silicon or the like is deposited at a thickness of 500 nm to 600 nm. The gate oxide film 32 and the gate electrode 31 are shaped into a desired form. As shown in FIG. 12e, a P-type impurity ion beam 49 such as boron is applied for carrying out ion implantation at an energy level of about 50 keV to 60 keV so that a dose amount of $1\times10^{13}/cm^2$ to $1\times10^{14}/cm^2$ is implanted. Thus, a P-type layer 40 is formed.

Figure 12F:
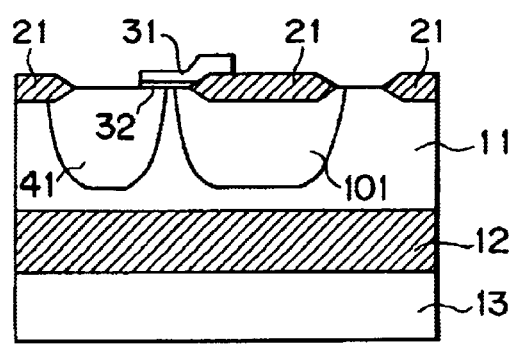
Figure 12G:
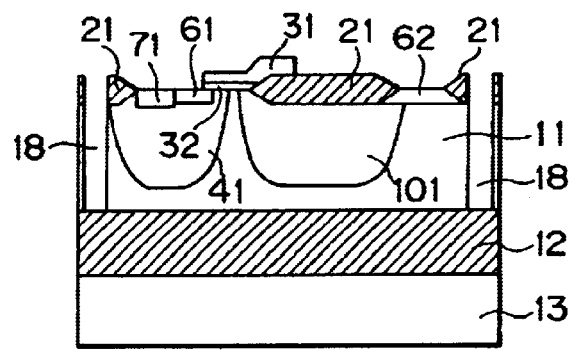

At this time, as shown in FIG. 12f, the device is placed in an atmosphere at a temperature of about 900° C. to 1100° C. for a time period of about 50 min. to 600 min. so that the P-type layer 40 is diffused. Thus, a P-type region 41 is formed. At this time, the N-type diffusion layer 101 is also diffused. Then, an N-type impurity ion beam such as arsenic is applied for carrying out ion implantation at an energy level of about 50 keV to 60 keV so that a dose amount of $1\times10^{15}/cm^2$ to $1\times10^{16}/cm^2$ is implanted. Also, a P-type impurity ion beam such as boron or $BF_2$ is applied for carrying out ion implantation at an energy level of about 50 keV to 60 keV so that a dose amount of $1\times10^{15}/cm^2$ to $1\times10^{16}/cm^2$ is implanted. In this way, as shown in FIG. 12g, high concentration N-type layers 61 and 62 and high concentration P-type layer 71 are formed. Then, the device is placed in an atmosphere at a temperature of about 800° C. to 1000° C. during a time period of about 5 min. to 60 min. so that diffusion is effected on the high concentration N-type layers 61 and 62 and the high concentration P-type layer 71. Thereafter, trenches 18 is formed in the Si substrate.

Figure 12H:
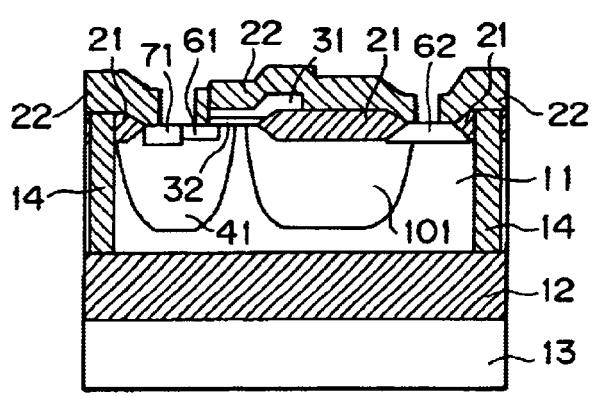

Then, as shown in FIG. 12h, the trenches are filled with an insulating film such as a silicon oxide film, and an interlayer insulating film 22 made of a silicon oxide film or the like is formed. Then, contact holes are formed at positions where the source electrode, the drain electrode and the gate electrode are provided. Thereafter, wiring layers are formed by a known process and the N-type lateral MOS field effect transistor is obtained.

While the above-described processes are those for fabricating the device based on the embodiment 1, the device based on the embodiment 2 can also be fabricated by the following processes. That is, the device is subjected to a diffusion process of adjusted temperature and time duration which was described with reference to FIG. 12f. In other words, the device is subjected to an atmosphere having a temperature of about 900° C. to 1100° C. during a time period of about 50 min. to 600 min. In this way, the device can be made to have the structure similar to that of embodiment 2.

Figure 13A:
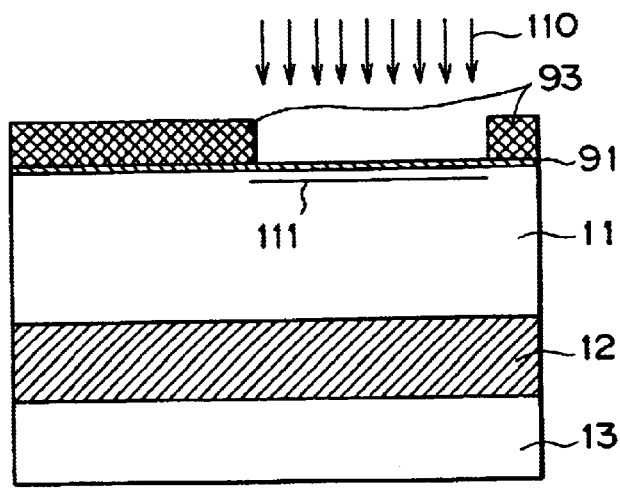
FIGS. 13a to 13c are diagrams for explaining steps of fabricating the N-type channel lateral MOS field effect transistor having a high withstand voltage as the ninth embodiment of the present invention.
Figure 13B:
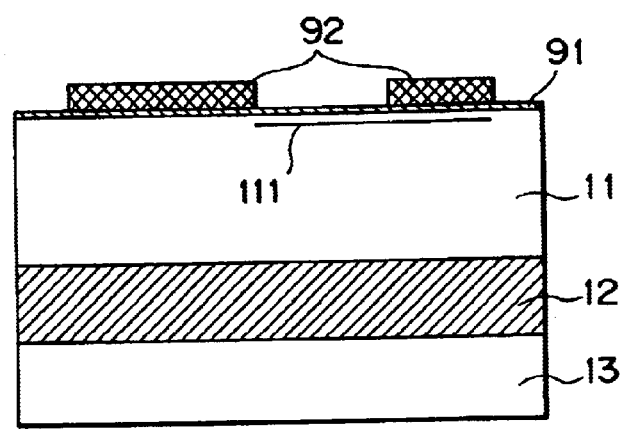
Figure 13C:
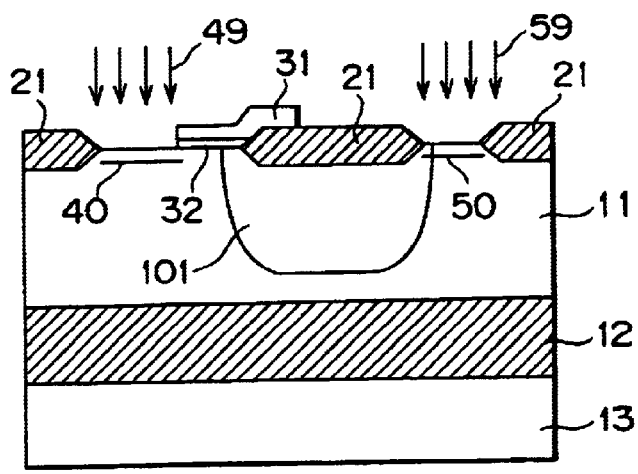

In more detail, as shown in FIG. 13a, a silicon oxide film 91 is formed on the Si substrate 11. Thereafter, a photoresist 93 is applied so as to protect places at which it is undesirable to form the N-type layer. Then, an ion beam 110 is applied for carrying out ion implantation at an energy level of about 50 keV to 60 keV so that a dose amount of $1\times10^{12}/cm^2$ to $1\times10^{13}/cm^2$ is implanted. Thus, an N-type impurity layer 111 is formed. Then, as shown in FIG. 13b, a silicon nitride film 92 is deposited and the same processes as those described with reference to FIG. 12c and the following are carried out. In this way, the structure shown in FIG. 6a can be produced. At this time, the device undergoes a diffusion process with adjusted temperature and time duration which was described with reference to FIG. 12f. That is, the device is placed in an atmosphere at a temperature of about 900° C. to 1100° C. during a time period of about 50 min. to 600 min. In this way, the structure shown in FIG. 6b can be produced.

Thereafter, the fabrication processes described with reference to FIGS. 12a to 12d are carried out. However, the process described with reference to FIG. 12e is replaced with a process shown in FIG. 13c. That is, ion implantation is effected with a P-type impurity ion beam 49 to form a P-type layer 40 while ion implantation is effected with an N-type impurity ion beam 59 such as that of phosphorous to form an N-type layer 50 at a time. Thereafter, the same processes as those described with reference to FIG. 12f and the following are carried out. In this way, the structure shown in FIG. 6c can be produced.

Embodiment 10

Figure 14A:
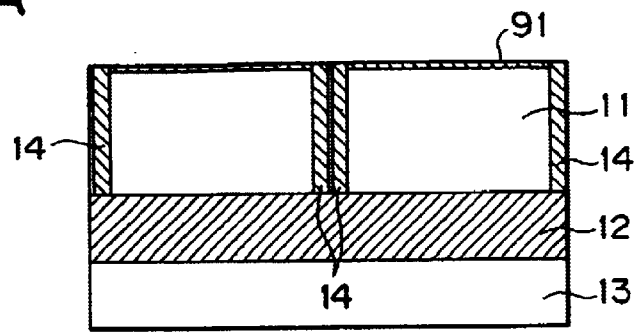
FIGS. 14a to 14h are diagrams for explaining steps of fabricating a semiconductor integrated circuit according to a tenth embodiment of the present invention in which an N-type channel lateral MOS field effect transistor having a high withstand voltage and a P-type channel lateral MOS field effect transistor having a high withstand voltage are fabricated.

Fabrication processes of the semiconductor integrated circuit as the fourth embodiment will be described. FIGS. 14a to 14h are cross-sectional views for the sequence of the fabrication processes of the semiconductor integrated circuit as the embodiment 4 in which the N-type lateral MOS field effect transistor and P-type lateral MOS field effect transistor are formed on the SOI substrate. As shown in FIG. 14a, a silicon oxide film 12 is deposited on the N-type or P-type Si substrate 13, an N-type Si substrate 11 is formed on the silicon oxide film 12, and trenches are formed within the Si substrate by dry etching method or the like. Thereafter, an insulating film such as a silicon oxide film and a polycrystalline silicon film is deposited by using CVD method so that the trenches are filled with an insulating film and a silicon oxide film 91 is formed.

Figure 14B:
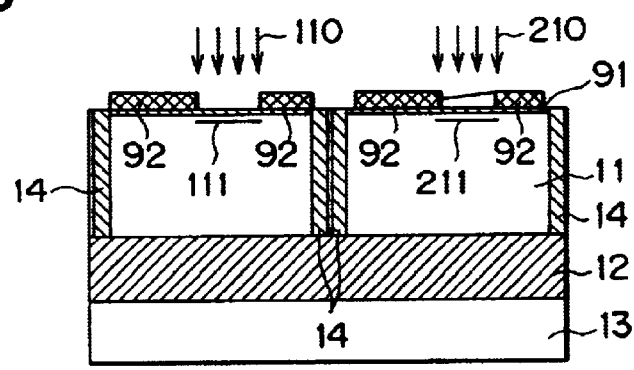

Then, as shown in FIG. 14b, a silicon nitride film 92 of a thickness of 50 nm to 600 nm is deposited by using CVD method or the like, and the deposited film undergoes working process so that a part thereof is removed. At this time, the N-type impurity ion beam 110 such as phosphorus beam is applied for carrying out ion implantation at an energy level of about 50 keV to 60 keV so that a dose amount of $1\times10^{12}/cm^2$ to $1\times10^{13}/cm^2$ is implanted. Also, the P-type impurity ion beam 210 such as boron beam is applied for carrying out ion implantation at an energy level of about 50 keV to 60 keV so that a dose amount of $1\times10^{12}/cm^2$ to $1\times10^{13}/cm^2$ is implanted. Thus, the N-type layer 111 and P-type layer 211 are formed within the substrate 11.

Figure 14C:
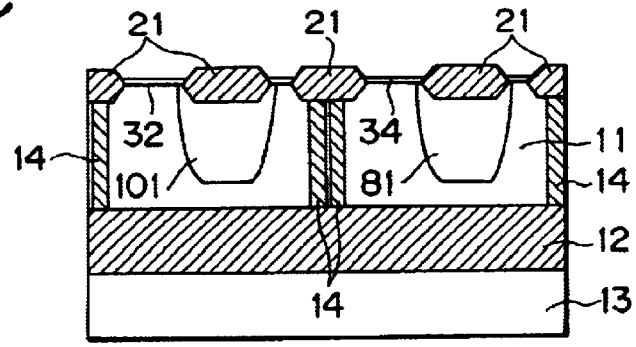

As shown in FIG. 14c, the device is placed in an atmosphere at a temperature of 900° C. to 1100° C. for oxidation, whereby a field oxide film 21 is formed. Thereafter, the silicon nitride film is removed. At this time, the N-type layer 111 and the P-type layer 211, which are formed at the process of FIG. 14b, are diffused, whereby the N-type region 101 and the P-type region 81 are formed as shown in FIG. 14c.

Figure 14D:
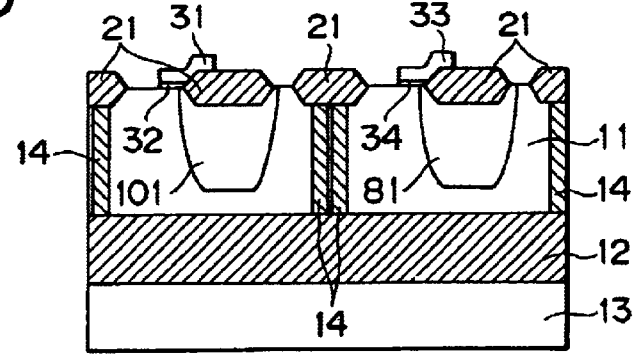
Figure 14E:
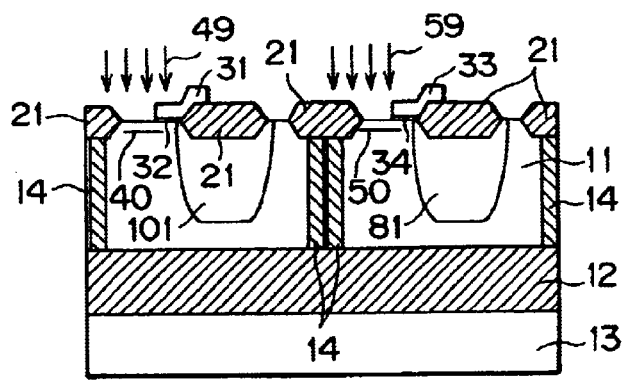

Then, as shown in FIG. 14d, a gate oxide film and a polycrystalline silicon film are deposited, and then they are processed to form gate oxide films 32 and 34 and gate electrodes 31 and 33. At this time, as shown in FIG. 14e, an P-type impurity ion beam 49 such as boron beam is applied for carrying out ion implantation at an energy level of about 50 keV to 60 keV so that a dose amount of $1\times10^{13}/cm^2$ to $1\times10^{14}/cm^2$ is implanted. Also, the N-type impurity ion beam 59 such as phosphorous beam is applied for carrying out ion implantation at an energy level of about 50 keV to 60 keV so that a dose amount of $1\times10^{13}/cm^2$ to $1\times10^{14}/cm^2$ is implanted. Thus, a P-type impurity layer 40 and an N-type layer 50 are formed within the substrate 11.

Figure 14F:
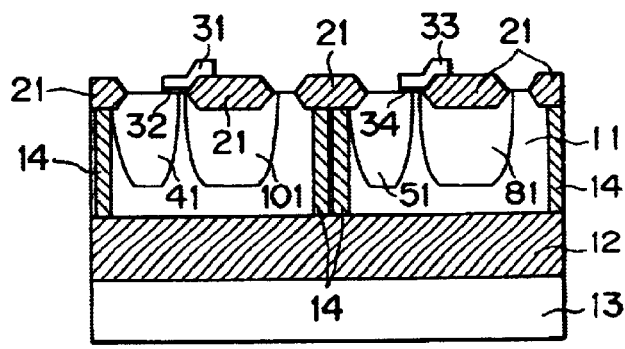
Figure 14G:
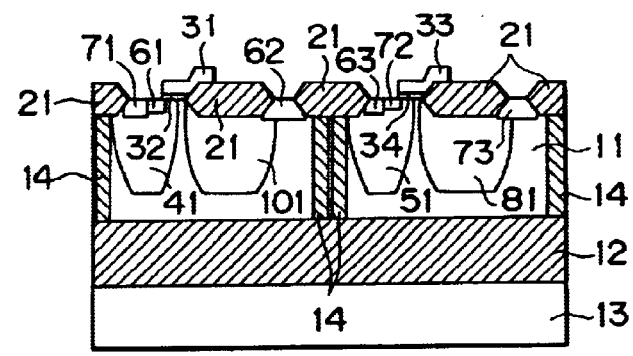
Figure 14H:
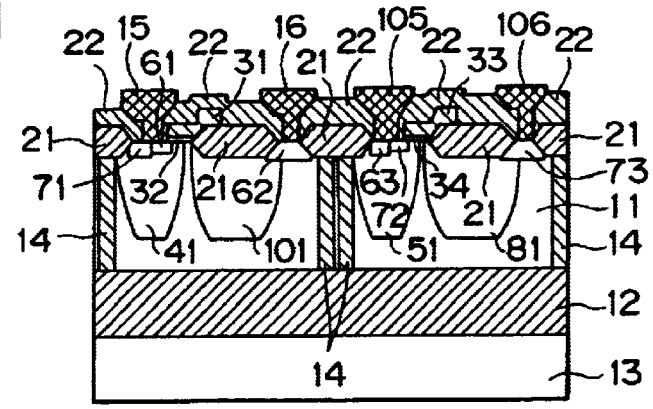

At this time, the device is placed in an atmosphere at a temperature of about 900° C. to 1100° C. for a time period of about 50 min. to 600 min. so that the P-type region 41 and the N-type region 51 are formed as shown in FIG. 14f. Then, an N-type impurity ion beam such as arsenic is applied for carrying out ion implantation at an energy level of about 50 keV to 60 keV so that a dose amount of $1\times10^{15}/cm^2$ to $1\times10^{16}/cm^2$ is implanted. Thus, as shown in FIG. 14g, high concentration N-type layers 61, 62 and 63 are formed. Also, a P-type impurity ion such as boron is applied for carrying out ion implantation at an energy level of about 50 keV to 60 keV so that a dose amount of $1\times10^{15}/cm^2$ to $1\times10^{16}/cm^2$ is implanted. In this way, high concentration P-type layers 71, 72 and 73 are formed. Then, an interlayer insulating film 22 is formed. Thereafter, contact holes are formed so that the source electrodes 15 and 105, the drain electrodes 16 and 106 and the gate electrodes 31 and 33 are electrically connected by means of wiring. Thus, the N-type lateral MOS field effect transistor and the P-type lateral MOS field effect transistor are fabricated.

Embodiment 11

FIGS. 15a to 15i are diagrams each showing a cross-sectional view of a part of a semiconductor integrated circuit in which an N-type channel lateral MOS field effect transistor and a P-type channel lateral MOS field effect transistor are formed on an SOI substrate. These diagrams are also useful for referring to the fabrication steps of the semiconductor integrated circuit.

Figure 15A:
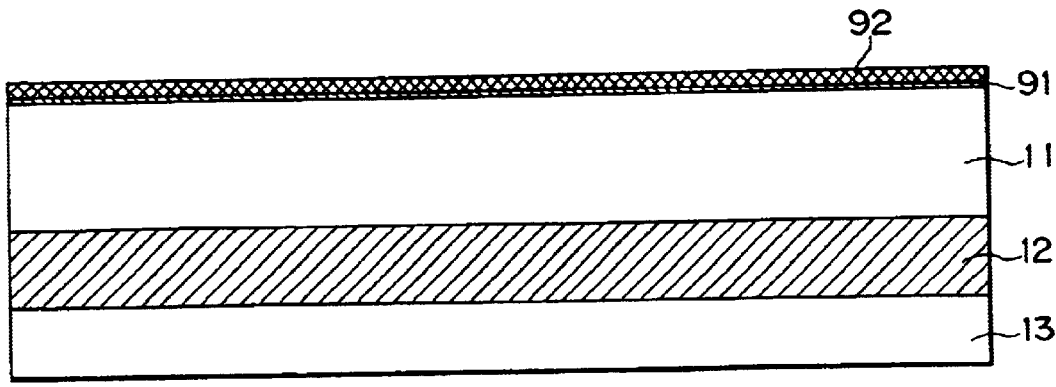
FIGS. 15a to 15i are diagrams for explaining steps of fabricating a semiconductor integrated circuit according to an eleventh embodiment of the present invention in which an N-type channel lateral MOS field effect transistor having a high withstand voltage and a P-type channel lateral MOS field effect transistor having a high withstand voltage are fabricated on an SOI substrate.
Figure 15B:
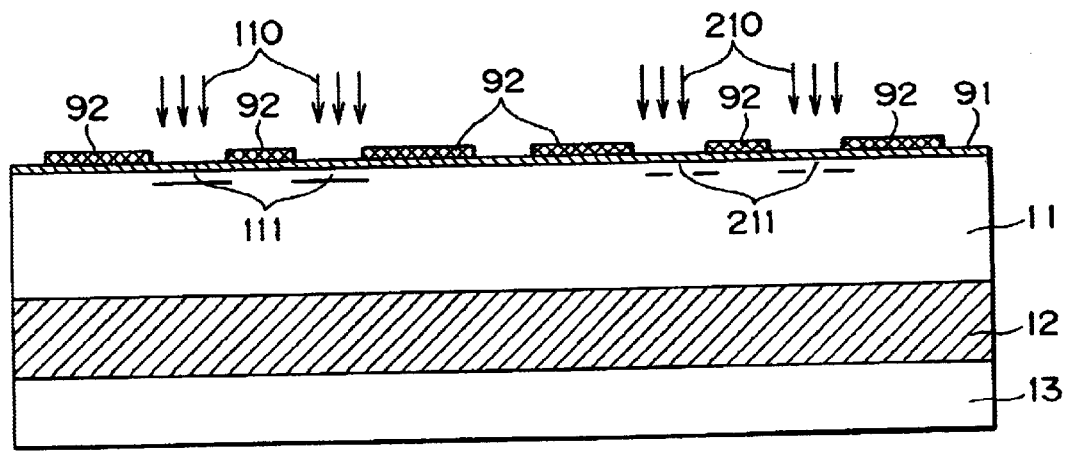

As shown in FIG. 15a, the silicon oxide film 12 is deposited on the N-type or P-type Si substrate 13, the N-type Si substrate 11 is formed on the silicon oxide film 12, a silicon oxide film 91 having a thickness of 50 nm to 600 nm is grown on the N-type Si substrate 11 by means of thermal oxidation method or the like, and then a silicon nitride film 92 having a thickness of 50 nm to 160 nm is deposited on the silicon oxide film 91. Next, as shown in FIG. 15b, the silicon nitride film 92 is processed so that a part thereof is removed. Then, an N-type impurity ion beam 110 such as phosphorous is applied for carrying out ion implantation at an energy level of about 50 keV to 60 keV so that a dose amount of $1\times10^{12}/cm^2$ to $1\times10^{14}/cm^2$ is implanted. Thus, a high concentration N-type layer 111 is formed within the Si substrate 11. Also, a P-type impurity ion beam 210 such as boron or $BF_2$ is applied for carrying out ion implantation at an energy level of about 50 keV to 60 keV so that a dose amount of $1\times10^{12}/cm^2$ to $1\times10^{14}/cm^2$ is implanted. Thus, a high concentration P-type layer 211 is formed within the Si substrate 11.

Figure 15C:
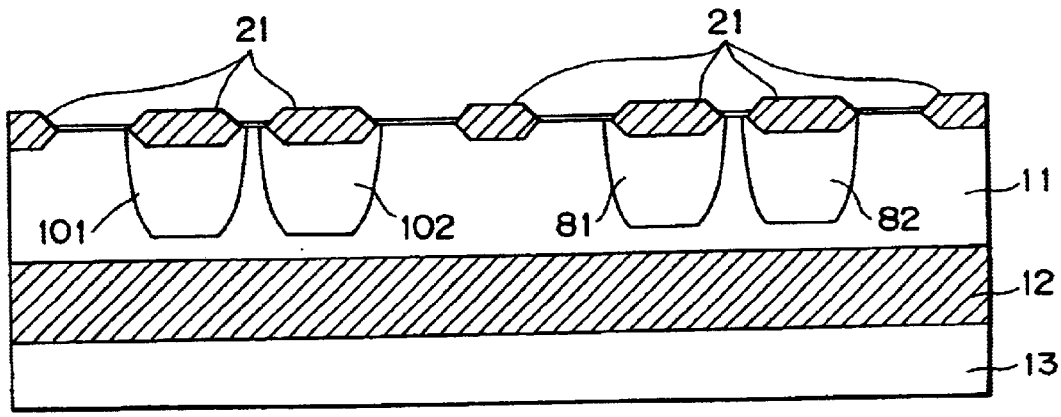

At this time, the device is placed in an atmosphere at a temperature of 900° C. to 1100° C. for oxidation for a time period of 50 min. to 600 min., so that the silicon nitride film 92 is removed. Thus, field oxide films 21 is formed as shown in FIG. 15c. At this time, the N-type impurity layer 111 and the P-type impurity layer 211, which are formed at the process of FIG. 15b, are diffused, whereby N-type regions 101 and 102 and P-type regions 81 and 82 are formed.

Figure 15D:
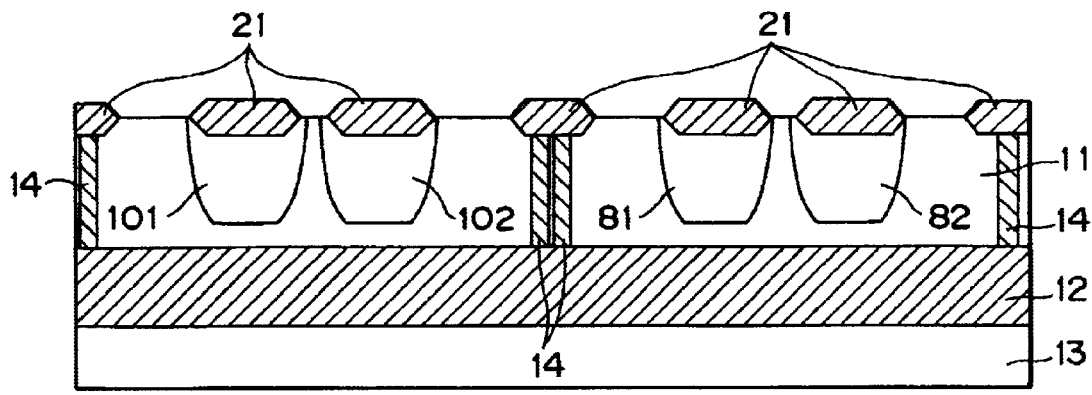
Figure 15E:
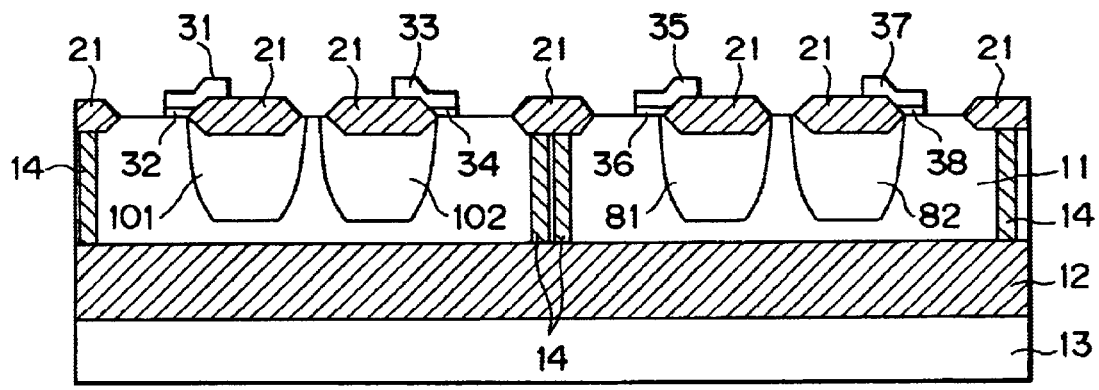

Then, trenches are formed by dry-etching or the like in the Si substrate 11, the trenches are filled with a proper material by CVD method or the like, whereby the trench 14 filled with an insulating film are formed as shown in FIG. 15d. At this time, as shown in FIG. 15e, the device is placed under an atmosphere at a temperature of 800° C. to 900° C. for oxidation so that a gate oxide film is formed, and further, a polycrystalline silicon film is deposited by CVD method. Thereafter, working is effected for forming gate oxide films 32, 34, 36 and 38 and gate electrodes 31, 33, 35 and 37.

Figure 15F:
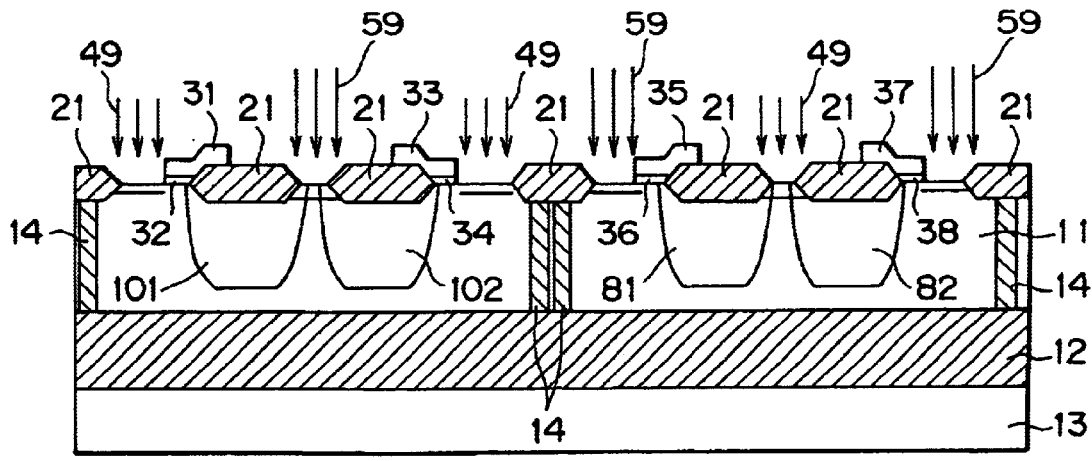
Figure 15G:
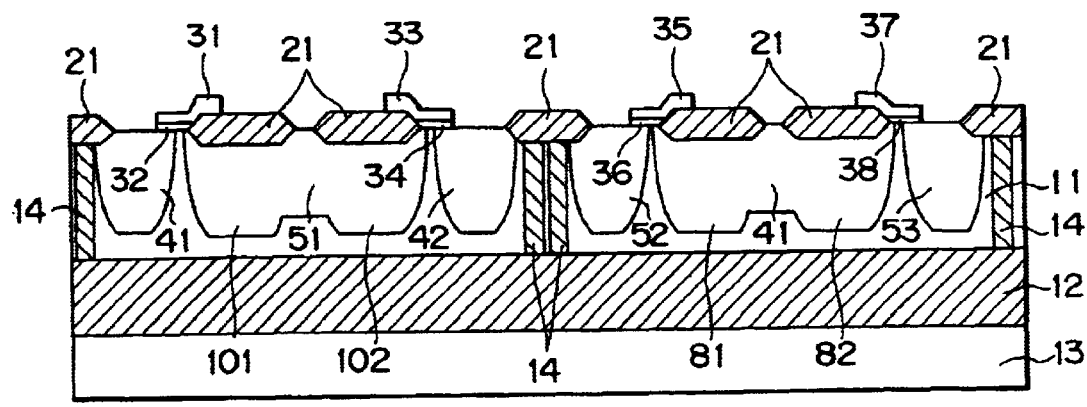

Then, as shown in FIG. 15f, an N-type impurity ion beam 59 such as phosphorous is applied for carrying out ion implantation at an energy level of about 50 keV to 60 keV so that a dose amount of $1\times10^{13}/cm^2$ to $1\times10^{14}/cm^2$ is implanted. Thus, the high concentration N-type layer is formed within the Si substrate 11. Also, a P-type impurity ion beam 49 such as boron or $BF_2$ is applied for carrying out ion implantation at an energy level of about 50 keV to 60 keV so that a dose amount of $1\times10^{13}/cm^2$ to $1\times10^{14}/cm^2$ is implanted. Thus, the high concentration P-type layer is formed within the Si substrate 11. At this time, as shown in FIG. 15g, the device is placed in an atmosphere at a temperature of 900° C. to 1100° C. for a time period of 50 min. to 600 min. so that diffusion is effected. In this way, P-type regions 41 and 42 are formed in the N-type lateral MOS field effect transistor and N-type regions 52 and 53 are formed in the P-type lateral MOS field effect transistor. At this time, a N-type region 51 is formed beneath the drain electrode of the N-type lateral MOS field effect transistor while a P-type region 41 is formed beneath the drain electrode of the P-type lateral MOS field effect transistor.

Figure 15H:
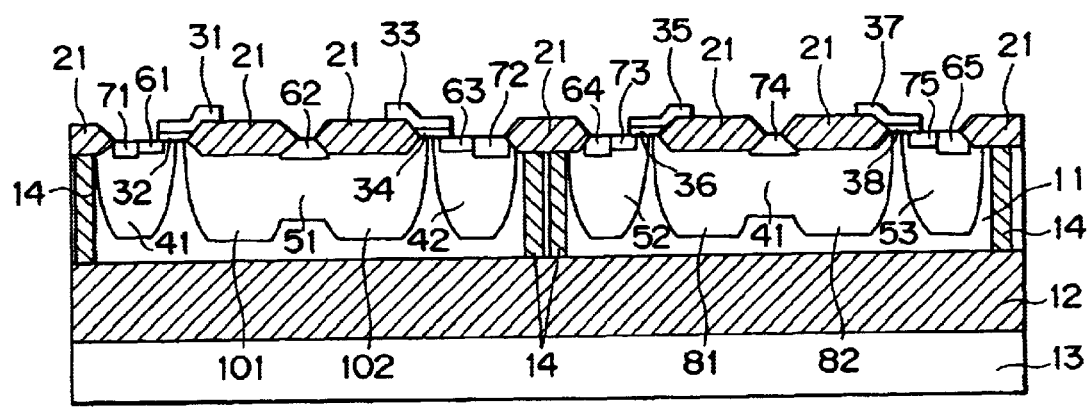
Figure 15I:
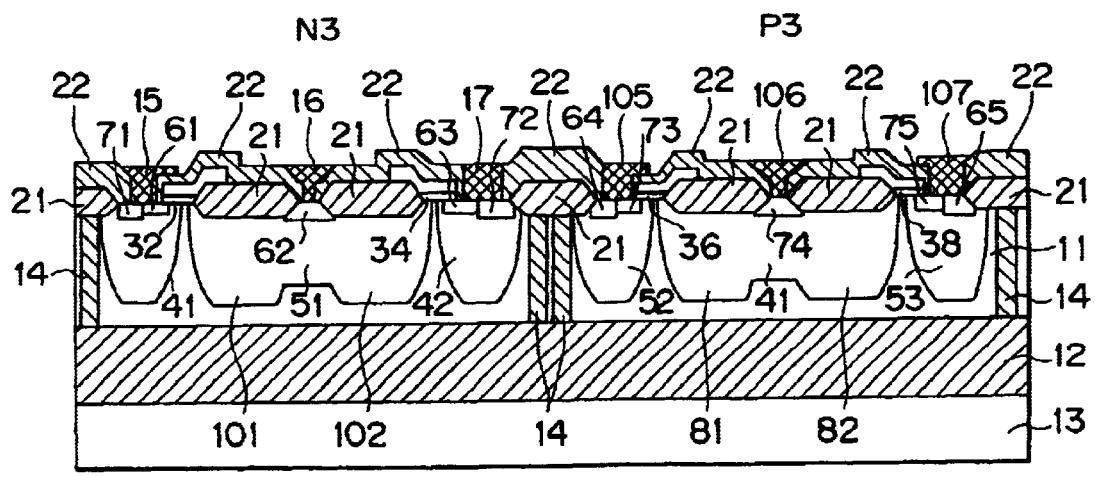

Then, as shown in FIG. 15h, high concentration N-type layers 61, 62, 63, 64 and 65 and high concentration P-type layers 71, 72, 73, 74 and 75 contacting to any of the source electrodes and drain electrodes of the MOS field effect transistors are formed. Then, as shown in FIG. 15i, an interlayer insulating film 22 is formed. Thereafter, contact holes are provided so that source electrodes 15 and 17 and a drain electrode 16 of the N-type channel MOS field effect transistor are formed. Also, contact holes are provided so that source electrodes 105 and 107 and a drain electrode 106 of the P-type channel MOS field effect transistor are formed.

Embodiment 12

FIGS. 16a to 16j are diagrams each showing a cross-sectional view of fabrication steps of the semiconductor integrated circuit such as a power IC in which elements having a high withstand voltage and CMOS field effect transistors having a low withstand voltage are provided in a mixed fashion. In particular, these diagrams are useful for explaining steps for fabricating a semiconductor integrated circuit in which an N-type channel lateral MOS field effect transistor having a high withstand voltage and an N-type channel lateral MOS field effect transistor having a low withstand voltage are formed on an SOI substrate.

Figure 16A:
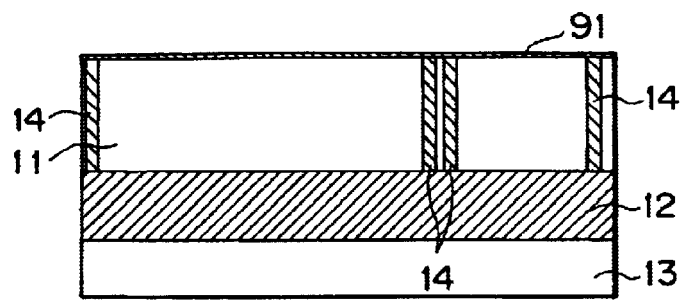
FIGS. 16a to 16j are diagrams for explaining steps of fabricating a semiconductor integrated circuit according to a twelfth embodiment of the present invention in which an N-type channel lateral MOS field effect transistor having a high withstand voltage and an N-type channel lateral MOS field effect transistor having a low withstand voltage are fabricated on an SOI substrate.

As shown in FIG. 16a, a silicon oxide film 12 is deposited on a Si substrate 13 which may be of N-type or P-type, and an N-type Si substrate 11 is formed on the silicon oxide film 12. Then, the trenches 14 are formed in the N-type Si substrate 11, and the trenches are filled with an insulating film such as silicon oxide film, polycrystalline silicon film. The upper surface of the device is made flat by a CMP (Chemical Mechanical Polishing) apparatus or the like. In this way, the trenches 14 filled with insulating film are provided. Then, a silicon oxide film 91 having a thickness of 50 nm to 600 nm is grown on Si substrate 11 by thermal oxidation method or the like. Thereafter, a silicon nitride film 92 having a thickness of 50 nm to 160 nm is deposited by CVD method or the like.

Figure 16B:
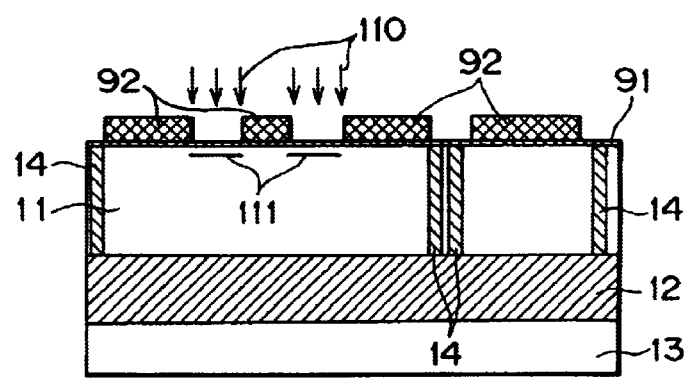
Figure 16C:
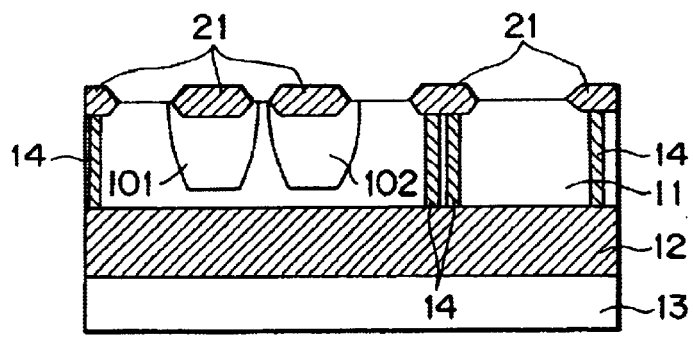

At this time, as shown in FIG. 16b, the silicon nitride film 92 is processed so that a part thereof is removed. Then, an N-type impurity ion beam 110 such as phosphorous is applied for carrying out ion implantation at an energy level of about 50 keV to 60 keV so that a dose amount of $1\times10^{12}/cm^2$ to $1\times10^{14}/cm^2$ is implanted. Thus, the high concentration N-type layer 111 is formed within the Si substrate 11. At this time, the device is placed in an atmosphere having a temperature of 900° C. to 1100° C. for a time period of 50 min. to 600 min. for oxidation, thereby to remove the silicon nitride film 92. Thus, field oxide films 21 is formed as shown in FIG. 16c. At this time, the N-type impurity layer 111 formed at the process of FIG. 16b is diffused, whereby N-type regions 101 and 102 are formed.

Figure 16D:
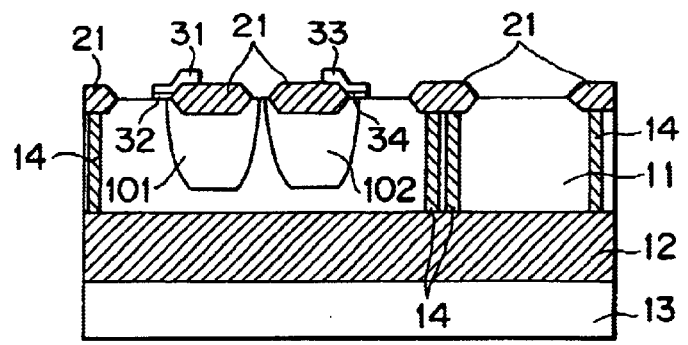

Then, as shown in FIG. 16d, the device is placed in atmosphere at a temperature of 800° C. to 900° C. for thermal oxidation so that a gate oxide film is formed, and a polycrystalline silicon film is deposited by CVD method. Thereafter, the device is processed so that gate oxide films 32 and 34 and gate electrodes 31 and 33 of the N-type lateral MOS field effect transistor having a high withstand voltage are formed.

Figure 16E:
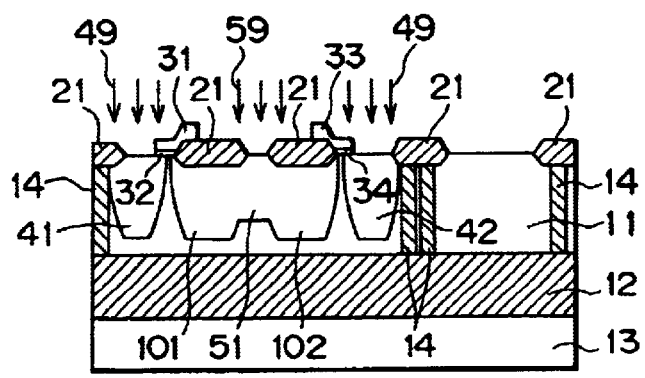
Figure 16F:
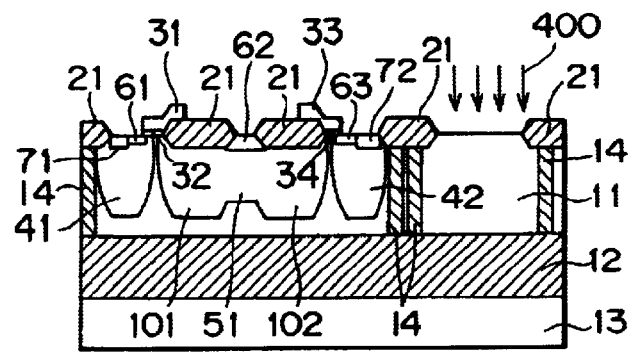

Next, as shown in FIG. 16e, an N-type impurity ion beam 59 such as phosphorous and a P-type impurity ion beam 49 such as boron or $BF_2$ are applied for carrying out ion implantation at an energy level of about 50 keV to 60 keV so that a dose amount of $1\times10^{13}/cm^2$ to $1\times10^{14}/cm^2$ is implanted. Thus, an N-type layer and a P-type layer are formed within the Si substrate 11. At this time, the device is placed in an atmosphere at a temperature of 900° C. to 1100° C. for a time period of 50 min. to 600 min. so that P-type regions 41 and 42 are formed in the N-type lateral MOS field effect transistor having a high withstand voltage. At this time, an N-type region 51 is formed beneath the drain electrode of the N-type lateral MOS field effect transistor. At this time, as shown in FIG. 16f, high concentration N-type layers 61, 62, 63 and high concentration P-type layers 71 and 72 are formed in any of the source region and the drain region of the N-type lateral MOS field effect transistor having a high withstand voltage.

Figure 16G:
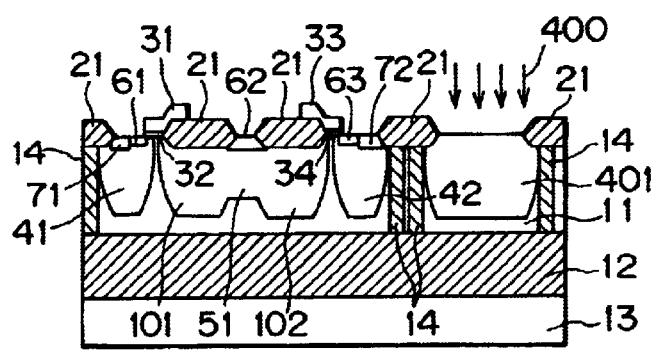
Figure 16H:
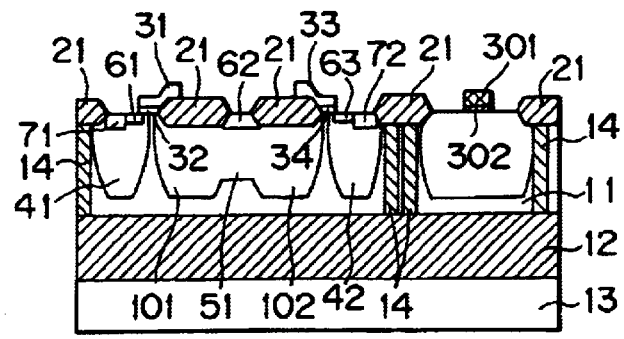

Next, as shown in FIG. 16g, a P-type impurity ion beam 400 such as boron or $BF_2$ is applied for carrying out ion implantation at an energy level of about 50 keV to 60 keV. Then, the device is placed in an atmosphere at a temperature of 900° C. to 1100° C. for a time period of 50 min. to 100 min. for diffusion so that a P-type well 401 is formed. Then, the device is placed in an atmosphere at a temperature of 800° C. to 900° C. for thermal oxidation to form a gate oxide film, and a polycrystalline silicon film is deposited by CVD method. Thereafter, the device is processed so that a gate oxide film 302 and a gate electrode 301 of the N-type MOS field effect transistor having a low withstand voltage are formed.

Figure 16I:
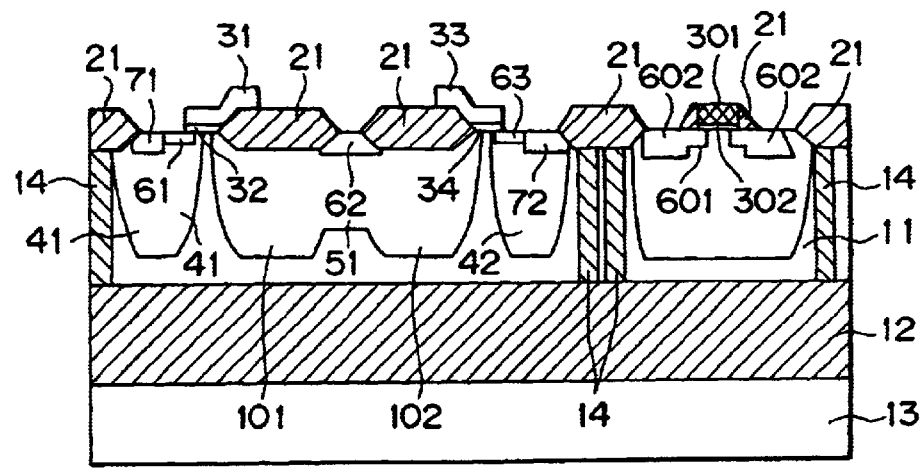
Figure 16J:
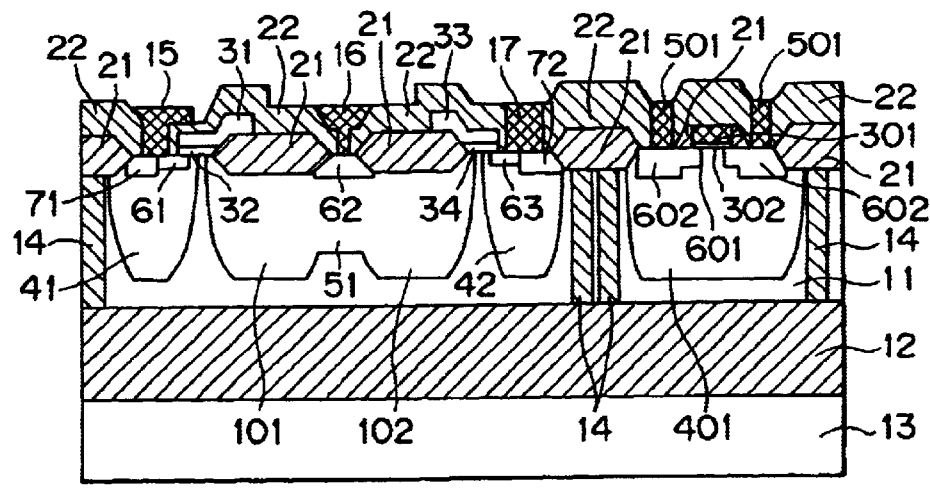

Then, as shown in FIG. 16i, the N-type source and drain regions are formed into an LDD (Lightly Doped Drain) structure by using a known technology. Next, as shown in FIG. 16j, an interlayer insulating film 22 is deposited by CVD method or the like, and contact holes are provided so as to form metal electrodes. In this way, a drain electrode 16 and a source electrodes 15 and 17 of the N-type lateral MOS field effect transistor having a high withstand voltage is created. Similarly, source/drain electrodes 602 and 601 of the N-type lateral MOS field effect transistor having a low withstand voltage is created.

Although in the present embodiment description has been made on a combination in which the N-type channel lateral MOS field effect transistor having a high withstand voltage and the N-type channel lateral MOS field effect transistor having a low withstand voltage are combined, there is another possible combination based on the present embodiment. For example, the N-type channel lateral MOS field effect transistor having a high withstand voltage may be replaced with a P-type channel lateral MOS field effect transistor having a high withstand voltage, an N-type channel MOS field effect transistor having a low withstand voltage, a P-type channel MOS field effect transistor having a low withstand voltage, a bipolar transistor and the like.

Embodiment 13

FIG. 17 is a diagram showing in a block form an engine control unit system in which automobile engine control is carried out according to the present embodiment. When an engine of an automobile is controlled, signals deriving from an injector, a throttle valve, a crank shat and the like (indicative of air-flow, an air-fuel ratio, water temperature, exhaust temperature, catalyst temperature, intake pressure, crank angle, a switch of the air-conditioner, a opening of throttle and the like) are detected by various sensor systems, and the detected signals are sent to the engine control unit. On the other hand, the engine control unit sends control signals from the control unit through a MOS field effect transistor having a high withstand voltage, an IGBT (Insulated Gate Bipolar Transistor) and the like, to the injector, the throttle valve, the crank and the like, whereby the air fuel ration is kept in an optimum state for the engine.

As shown in FIG. 17, the engine control unit of the present embodiment includes three kinds of blocks. However, these blocks may be built in a single chip or alternatively, they are provided in a plurality of chips separately. In any of the cases, each driver may be formed of a device having a high withstand voltage. A power IC circuit containing the N-type lateral MOS field effect transistor having a high withstand voltage or the P-type lateral MOS field effect transistor having a high withstand voltage according to the present invention may be utilized for the device with the high withstand voltage. If the device is arranged to contain the power IC circuit including the N-type lateral MOS field effect transistor having a high withstand voltage or the P-type lateral MOS field effect transistor having a high withstand voltage according to the present invention, the chip size may be made small. Moreover, according to the present invention, it is possible to respond to the request for making the Si layer serving as the device formation area of the SOI substrate thin. Therefore, if a microcomputer or the like is built in a single chip of device, the source region and the drain region can be brought into contact with the buried oxide film to eliminate parasitic capacitance. Therefore, it is expected that the microcomputer can be operated at a high speed.

Embodiment 14

Figure 18:
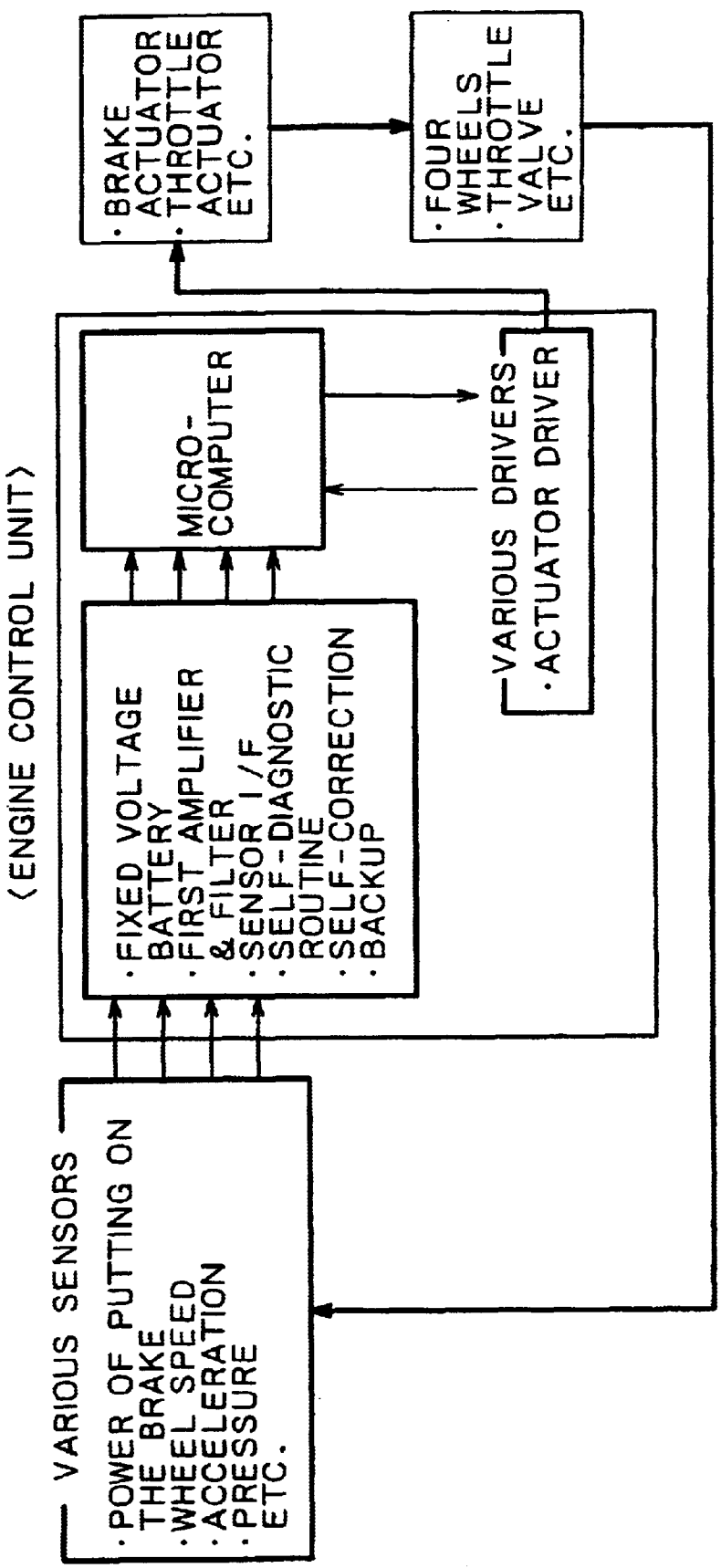
FIG. 18 is a block diagram of an engine control unit in which an N-type channel lateral MOS field effect transistor having a high withstand voltage according to a fourteenth embodiment of the present invention is suitably employed.

FIG. 18 is a diagram showing in a block form an engine control unit system employed in a brake control system, a suspension control system, a transmission control system, and the like to which reference is made for explaining the present embodiment. Signals (indicative of power of putting on the brake, wheel speed, acceleration and the like) supplied from wheels, a brake, throttle or the like of the automobile are detected by various sensor system, and the detected signals are supplied to the engine control unit. The engine control unit sends control signals corresponding to the speed of the automobile, the state of the road, the pedal putting state of the driver, to an actuator driver. The actuator driver transmits the control signals through a MOS field effect transistor having a high withstand voltage, an IGBT and the like, to a brake actuator and a throttle valve actuator.

Similarly to the embodiment 13, if the power IC circuit for the device with the high withstand voltage utilized for the actuator driver is arranged to include the N-type lateral MOS field effect transistor having a high withstand voltage or the P-type lateral MOS field effect transistor having a high withstand voltage according to the present invention, the chip size may be made small. Moreover, if the microcomputer or the like is built in a single chip of device, the source region and the drain region can be brought into contact with the buried oxide film. Therefore, it is expected that the microcomputer will have a high performance and can be operated at a high speed.

Although certain preferred embodiments of the present invention have been shown and described in detail, such descriptions are illustrative and not restrictive. Therefore, it should be understood that various changes and modifications may be made without departing from the spirit or scope of the appended claims, and all variations which come within the meaning of the claims are intended to be embraced therein.

What is claimed is:

1. An insulated gate field effect transistor, comprising:
   an SOI (Silicon On Insulator) substrate providing a first conductivity type device formation area;

a source electrode formed in the SOI substrate;

a couple of semiconductor layers of the first conductivity type and a second conductivity type contacted to the source electrode;

a gate insulating film and a gate electrode contacted to the first conductivity type semiconductor layer;

a field insulating film contacted to the gate electrode;

a drain electrode disposed at a lateral position with respect to the gate electrode through the field insulating film;

a first conductivity type semiconductor layer contacted to the drain electrode; and, a second conductivity type semiconductor region (body layer) contacted to the gate insulating film and the couple of semiconductor layers of the first and the second conductivity type contacted to the source electrode, wherein the SOI substrate providing the device formation area has a first conductivity type semiconductor region, which has an impurity concentration higher than the impurity concentration of the device formation area, formed so that the first conductivity type semiconductor region is contacted to a part of the gate insulating film and the field insulating film formed between the source electrode and the drain electrode, and extends to be contacted to the first conductivity type semiconductor layer contacted to the drain electrode; and wherein the first conductivity type semiconductor layer contacted to the drain electrode is further contacted to the first conductivity type device formation area.

2. An insulated gate field effect transistor according to claim 1, wherein the second conductivity type semiconductor region contacted to the couple of semiconductor layers of the first and the second conductivity type, each of which being contacted to the source electrode, extends to be contacted to a buried insulating film provided beneath the SOI substrate.

3. An insulated gate field effect transistor according to claim 1, wherein the first conductivity type semiconductor layer contacted to the drain electrode is made involved in the first conductivity type semiconductor region.

4. A semiconductor integrated circuit composed of an insulated gate field effect transistor according to claim 1 and other type of insulated gate field effect transistor, the other type of insulated gate field effect transistor, comprising:

the SOI substrate shared with the insulated gate field effect transistor according to claim 1, providing a device formation area;

a source electrode formed in the SOI substrate;

a couple of semiconductor layers of the first conductivity type and the second conductivity type contacted to a source electrode;

a gate insulating film and a gate electrode contacted to the second conductivity type semiconductor layer contacted to the source electrode;

a field insulating film contacted to the gate electrode;

a drain electrode disposed at a lateral position with respect to the gate electrode through the field insulating film;

a second conductivity type semiconductor layer contacted to the drain electrode;

a first conductivity type semiconductor region (body layer) contacted to a gate insulating film and the couple of semiconductor layers of the first and second conductivity types contacted to the source electrode; and a second conductivity type semiconductor region contacted to a gate insulating film and the second conductivity type semiconductor layer which is contacted to a drain electrode, wherein the second conductivity type semiconductor region has a depth allowable to form a PN-junction together with the device formation area.

5. A semiconductor integrated circuit according to claim 4, wherein the other type of insulated gate field effect transistor is arranged so that the first conductivity type semiconductor region contacted to the couple of semiconductor layers of the first and the second conductivity type, each of which being contacted to the source electrode, extends to be contacted to a buried insulating film provided beneath the SOI substrate.

6. An insulated gate field effect transistor, comprising:

an SOI (Silicon On Insulator) substrate providing a first conductivity type device formation area;

a trench filled with an insulating film formed in the SOI substrate;

a first source electrode disposed adjacent to the trench;

a first couple of semiconductor layers of the first conductivity type and a second conductivity type contacted to the first source electrode;

a first gate insulating film and a first gate electrode contacted to the first conductivity type semiconductor layer which is contacted to the first source electrode;

a first field insulating film contacted to the first gate electrode;

a drain electrode disposed at a lateral position with respect to the first gate electrode through the first field insulating film;

a first conductivity type semiconductor diffusion layer contacted to the drain electrode;

a second field insulating film contacted to the first conductivity type semiconductor diffusion layer which is contacted to the drain electrode;

a second gate insulating film and a second gate electrode disposed at a lateral position with respect to the drain electrode through the second field insulating film;

a second source electrode formed in the SOI substrate;

a second couple of semiconductor layers of the first conductivity type and the second conductivity type contacted to the second source electrode;

a first second conductivity type semiconductor region (first body layer) contacted to the first gate insulating film and the first couple of semiconductor layers of the first and the second conductivity type contacted to the first source electrode;

a second second conductivity type semiconductor region (second body layer) contacted to the second gate insulating film and the second couple of semiconductor layers of the first and the second conductivity type contacted to the second source electrode; and a trench filled with an insulating film disposed adjacent to the second source electrode, wherein the SOI substrate providing the device formation area has a first first conductivity type semiconductor region, which has an impurity concentration higher than the impurity concentration of the device formation area, formed so that the first first conductivity type semiconductor region is contacted to a part of the first gate insulating film and the first field insulating film formed between the first source electrode and the drain electrode, and extends to be contacted to the first conductivity type semiconductor diffusion layer contacted to the drain electrode, wherein the first conductivity type semiconductor diffusion layer contacted to the drain electrode is further contacted to the device formation area, and, the SOI substrate providing the device formation area also has a second first conductivity type semiconductor region, which has an impurity concentration higher than the impurity concentration of the device formation area, formed so that the second first conductivity type semiconductor region is contacted to a part of the second gate insulating film and the second field insulating film formed between the second source electrode and the drain electrode, and extends to be contacted to the first conductivity type semiconductor diffusion layer contacted to the drain electrode.

7. An insulated gate field effect transistor according to claim 6, wherein the first second conductivity type semiconductor region (first body layer) and the second second conductivity type semiconductor region (second body layer) extend to be contacted to a buried insulating film provided beneath the SOI substrate.

8. An insulated gate field effect transistor, comprising:
an SOI (Silicon On Insulator) substrate providing a first conductivity type device formation area;
a drain electrode disposed at a lateral position with respect to a gate electrode through a field insulating film;
a first conductivity type semiconductor layer contacted to the drain electrode and the first conductivity type device formation area,
wherein the SOI substrate providing the device formation area has a first conductivity type semiconductor region that extends to be only partially contacted to the first conductivity type semiconductor layer contacted to the drain electrode.

9. An insulated gate field effect transistor according to claim 8, further comprising:
a source electrode formed in the SOI substrate;
a couple of semiconductor layers of the first conductivity type and a second conductivity type contacted to the source electrode, wherein the gate insulating film and the gate electrode contacted to the first conductivity type semiconductor layer; and
a field insulating film contacted to the gate electrode.

10. An insulated gate field effect transistor according to claim 9, further comprising:
a second conductivity type semiconductor region (body layer) contacted to the gate insulating film and the couple of semiconductor layers of the first and the second conductivity type contacted to the source electrode.

11. An insulated gate field effect transistor according to claim 10, wherein the first conductivity type semiconductor region has an impurity concentration higher than the impurity concentration of the device formation area, and wherein the first conductivity type semiconductor region is formed so that the first conductivity type semiconductor region is contacted to a part of the gate insulating film and the field insulating film formed between the source electrode and the drain electrode.

12. An insulated gate field effect transistor according to claim 8, wherein the second conductivity type semiconductor region contacted to the couple of semiconductor layers of the first and the second conductivity type, each of which being contacted to the source electrode, extends to be contacted to a buried insulating film provided beneath the SOI substrate.

13. An insulated gate field effect transistor according to claim 8, wherein the first conductivity type semiconductor layer contacted to the drain electrode is made involved in the first conductivity type semiconductor region.

14. A semiconductor integrated circuit composed of an insulated gate field effect transistor according to claim 8, further comprising:
an other type of insulated gate field effect transistor, the other type of insulated gate field effect transistor, comprising:
the SOI substrate shared with the insulated gate field effect transistor, providing a device formation area;
a source electrode formed in the SOI substrate;
a couple of semiconductor layers of the first conductivity type and the second conductivity type contacted to a source electrode;
a gate insulating film and a gate electrode contacted to the second conductivity type semiconductor layer contacted to the source electrode;
a field insulating film contacted to the gate electrode;
a drain electrode disposed at a lateral position with respect to the gate electrode through the field insulating film;
a second conductivity type semiconductor layer contacted to the drain electrode;
a first conductivity type semiconductor region (body layer) contacted to a gate insulating film and the couple of semiconductor layers of the first and second conductivity types contacted to the source electrode; and
a second conductivity type semiconductor region contacted to a gate insulating film and the second conductivity type semiconductor layer which is contacted to a drain electrode, wherein the second conductivity type semiconductor region has a depth allowable to form a PN-junction together with the device formation area.

15. A semiconductor integrated circuit according to claim 14, wherein the other type of insulated gate field effect transistor is arranged so that the first conductivity type semiconductor region contacted to the couple of semiconductor layers of the first and the second conductivity type, each of which being contacted to the source electrode, extends to be contacted to a buried insulating film provided beneath the SOI substrate.

16. An insulated gate field effect transistor, comprising:
an SOI (Silicon On Insulator) substrate providing a first conductivity type device formation area;
a drain electrode disposed at a lateral position with respect to a first gate electrode through a first field insulating film;
a first conductivity type semiconductor diffusion layer contacted to the drain electrode and the first conductivity type device formation area,
wherein the SOI substrate providing the device formation area has a first first conductivity type semiconductor region that extends to be only partially contacted to the first conductivity type semiconductor diffusion layer contacted to the drain electrode.

17. An insulated gate field effect transistor according to claim 16, further comprising:
a trench filled with an insulating film formed in the SOI substrate;
a first source electrode disposed adjacent to the trench;
a first couple of semiconductor layers of the first conductivity type and a second conductivity type contacted to the first source electrode, wherein the first gate insulating film and the first gate electrode are contacted to the first conductivity type semiconductor layer which is contacted to the first source electrode; and a first field insulating film contacted to the first gate electrode.

18. An insulated gate field effect transistor according to claim 17, further comprising:

a second field insulating film contacted to the first conductivity type semiconductor diffusion layer which is contacted to the drain electrode;

a second gate insulating film and a second gate electrode disposed at a lateral position with respect to the drain electrode through the second field insulating film;

a second source electrode formed in the SOI substrate;

a second couple of semiconductor layers of the first conductivity type and the second conductivity type contacted to the second source electrode;

a first second conductivity type semiconductor region (first body layer) contacted to the first gate insulating film and the first couple of semiconductor layers of the first and the second conductivity type contacted to the first source electrode;

a second second conductivity type semiconductor region (second body layer) contacted to the second gate insulating film and the second couple of semiconductor layers of the first and the second conductivity type contacted to the second source electrode; and a trench filled with an insulating film disposed adjacent to the second source electrode.

19. An insulated gate field effect transistor according to claim 18, wherein the first first conductivity type semiconductor region has an impurity concentration higher than the impurity concentration of the device formation area, and is formed so that the first first conductivity type semiconductor region is contacted to a part of the first gate insulating film and the first field insulating film formed between the first source electrode and the drain electrode.

20. An insulated gate field effect transistor according to claim 19, wherein the SOI substrate providing the device formation area also has a second first conductivity type semiconductor region, which has an impurity concentration higher than the impurity concentration of the device formation area, formed so that the second first conductivity type semiconductor region is contacted to a part of the second gate insulating film and the second field insulating film formed between the second source electrode and the drain electrode, and extends to be contacted to the first conductivity type semiconductor diffusion layer contacted to the drain electrode.

21. An insulated gate field effect transistor according to claim 20, wherein the first second conductivity type semiconductor region (first body layer) and the second second conductivity type semiconductor region (second body layer) extend to be contacted to a buried insulating film provided beneath the SOI substrate.

22. An insulated gate field effect transistor according to claim 1, wherein the first conductivity type semiconductor region has an impurity concentration that is higher than that of the device formation area and lower than that of the first conductivity type semiconductor layer.

23. An insulated gate field effect transistor according to claim 6, wherein the first conductivity type semiconductor region has an impurity concentration that is higher than that of the first conductivity type device formation area and lower than that of the first conductivity type semiconductor layer.

24. An insulated gate field effect transistor according to claim 8, wherein the first conductivity type semiconductor region has an impurity concentration that is higher than that of the first conductivity type device formation area and lower than that of the first conductivity type semiconductor layer.

25. An insulated gate field effect transistor according to claim 16, wherein the first conductivity type semiconductor region has an impurity concentration that is higher than that of the first conductivity type device formation area and lower than that of the first conductivity type semiconductor layer.

* * * * *